(12) United States Patent
Hong et al.

(10) Patent No.: US 11,029,724 B2
(45) Date of Patent: Jun. 8, 2021

(54) DISPLAY DEVICE WITH PRESSURE SENSOR

(71) Applicant: Samsung Display Co., Ltd., Yongin-si (KR)

(72) Inventors: Won Ki Hong, Yongin-si (KR); Tae Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/158,311

(22) Filed: Oct. 12, 2018

(65) Prior Publication Data

US 2019/0179470 A1    Jun. 13, 2019

(30) Foreign Application Priority Data

Dec. 12, 2017   (KR) .................. 10-2017-0170572

(51) Int. Cl.
*G06F 3/041* (2006.01)
*G09F 9/30* (2006.01)
(Continued)

(52) U.S. Cl.
CPC .......... *G06F 1/1618* (2013.01); *G06F 1/1641* (2013.01); *G06F 1/1643* (2013.01);
(Continued)

(58) Field of Classification Search
CPC .... G06F 1/1618; G06F 1/1641; G06F 1/1643; G06F 1/1652; G06F 2203/04102; G06F 3/0414; G06F 2203/044; G06F 3/04144; G09F 9/301; G09G 2310/0264; G09G 3/3233; G09G 3/3266; G09G 3/3275;
(Continued)

(56) References Cited

U.S. PATENT DOCUMENTS

| | | |
|---|---|---|
| 7,511,702 B2 | 3/2009 | Hotelling |
| 7,538,760 B2 | 5/2009 | Hotelling et al. |

(Continued)

FOREIGN PATENT DOCUMENTS

| | | |
|---|---|---|
| KR | 10-2011-0034891 | 4/2011 |
| KR | 10-2015-0036576 | 4/2015 |

(Continued)

*Primary Examiner* — Hong Zhou
(74) *Attorney, Agent, or Firm* — H.C. Park & Associates, PLC

(57) ABSTRACT

A display device includes: a display panel; and a sensor provided on one surface of the display panel to detect external pressure. The sensor includes: a first base substrate having a sensing region and a non-sensing region; a plurality of first conductive patterns extending in a first direction in the sensing region of the first base substrate; a second base substrate facing opposite to the first base substrate; a plurality of second conductive patterns extending in a second direction intersecting the first conductive patterns disposed on a surface of the second base substrate; a pressure sensitive material layer disposed between the first and second conductive patterns, the pressure sensitive material layer having a resistance that varies in response to pressure; and an adhesive layer connecting the first and second base substrate, the adhesive layer being disposed in the same layer as the pressure sensitive material layer.

36 Claims, 23 Drawing Sheets

(51) Int. Cl.
  *G09G 3/3233* (2016.01)
  *G09G 3/3266* (2016.01)
  *G09G 3/3275* (2016.01)
  *H01L 27/32* (2006.01)
  *H01L 51/00* (2006.01)
  *H01L 51/52* (2006.01)
  *G06F 1/16* (2006.01)

(52) U.S. Cl.
  CPC .......... *G06F 1/1652* (2013.01); *G06F 3/0414* (2013.01); *G06F 3/04144* (2019.05); *G09G 3/3233* (2013.01); *G09G 3/3266* (2013.01); *G09G 3/3275* (2013.01); *H01L 27/3225* (2013.01); *H01L 27/3246* (2013.01); *H01L 27/3276* (2013.01); *H01L 51/0097* (2013.01); *H01L 51/5203* (2013.01); *H01L 51/5246* (2013.01); *H01L 51/5253* (2013.01); *G06F 2203/04102* (2013.01); *G09F 9/301* (2013.01); *G09G 2310/0264* (2013.01); *H01L 2251/5338* (2013.01)

(58) Field of Classification Search
  CPC ......... H01L 2251/5338; H01L 27/3246; H01L 27/3297; H01L 51/0097; H01L 51/5203; H01L 51/5246; H01L 51/5253
  See application file for complete search history.

(56) References Cited

U.S. PATENT DOCUMENTS

| | | | |
|---|---|---|---|
| 8,654,524 B2 | 2/2014 | Pance et al. | |
| 8,686,952 B2 | 4/2014 | Burrough et al. | |
| 8,787,006 B2 | 7/2014 | Golko et al. | |
| 8,893,565 B2 | 11/2014 | White et al. | |
| 9,178,509 B2 | 11/2015 | Bernstein | |
| 9,274,660 B2 | 3/2016 | Bernstein et al. | |
| 9,501,195 B1* | 11/2016 | Kim | G02F 1/13338 |
| 9,513,663 B2 | 12/2016 | Jones et al. | |
| 9,886,116 B2 | 2/2018 | Parivar et al. | |
| 2011/0157087 A1* | 6/2011 | Kanehira | G06F 3/0414 345/174 |
| 2012/0038563 A1* | 2/2012 | Park | G06F 3/0414 345/173 |
| 2013/0234734 A1* | 9/2013 | Iida | G06F 3/044 324/661 |
| 2014/0049522 A1* | 2/2014 | Mathew | H05B 33/0896 345/204 |
| 2014/0085213 A1 | 3/2014 | Huppi et al. | |
| 2014/0132553 A1* | 5/2014 | Park | G06F 3/044 345/174 |
| 2014/0226275 A1* | 8/2014 | Ko | G06F 1/1626 361/679.27 |
| 2015/0062467 A1* | 3/2015 | Kang | G06F 3/044 349/12 |
| 2016/0011689 A1* | 1/2016 | Kim | G06F 3/044 345/173 |
| 2016/0226017 A1* | 8/2016 | Nam | H01L 51/5246 |
| 2016/0282999 A1* | 9/2016 | Hwang | G06F 3/044 |
| 2016/0329520 A1 | 11/2016 | Namkung et al. | |
| 2017/0220162 A1* | 8/2017 | Ko | G06F 3/0412 |
| 2017/0357357 A1* | 12/2017 | Hinson | G06F 3/0414 |
| 2018/0095582 A1* | 4/2018 | Hwang | G06F 3/0412 |
| 2018/0321708 A1* | 11/2018 | Wu | G06F 1/1643 |

FOREIGN PATENT DOCUMENTS

| | | |
|---|---|---|
| KR | 10-1781928 | 6/2017 |
| KR | 10-2016-0130921 | 4/2018 |

* cited by examiner

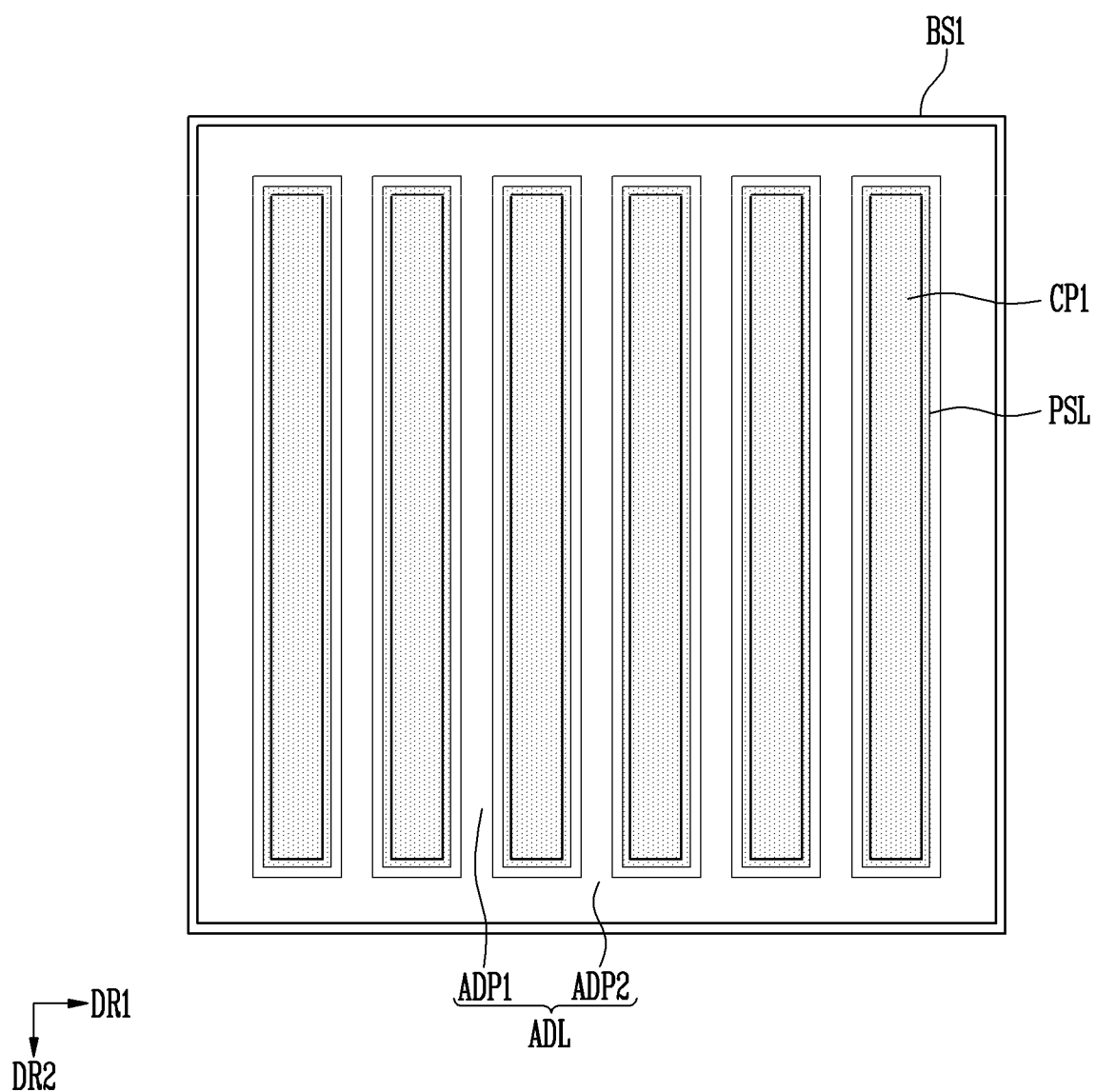

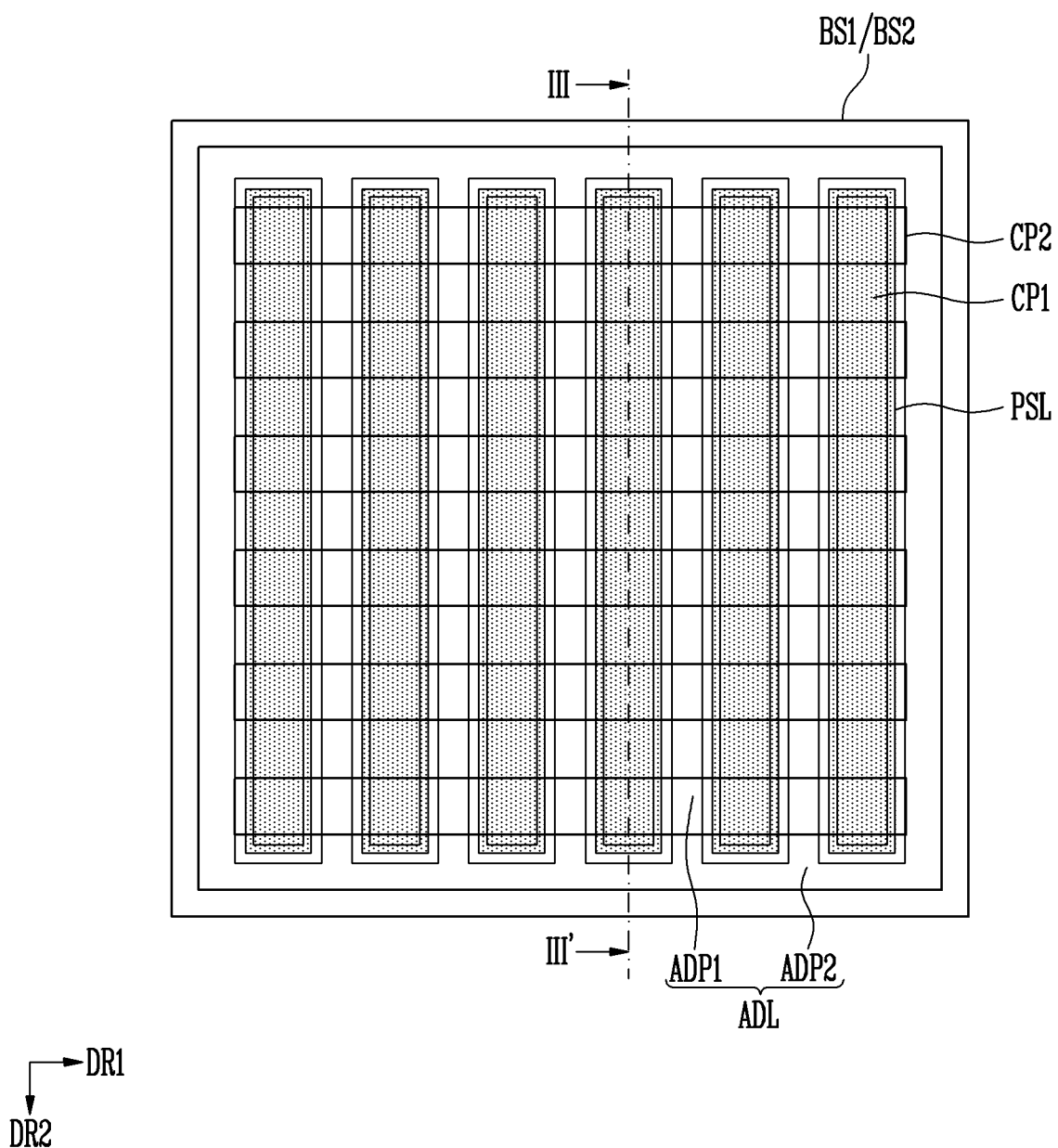

DISPLAY DEVICE WITH PRESSURE SENSOR

CROSS-REFERENCE TO RELATED APPLICATION

This application claims priority from and the benefit of Korean Patent Application 10-2017-0170572, filed on Dec. 12, 2017, which is hereby incorporated by reference for all purposes as if fully set forth herein.

BACKGROUND

Field

Exemplary implementations of the invention relate generally to a display device and, more specifically, to a display device having a pressure sensor.

Discussion of the Background

As interest in information displays and demand for portable information media increase, research and commercialization has centered on display devices.

Recent display devices include touch sensors for receiving touch inputs of users in addition to image display functions. Accordingly, the users can more conveniently use the display devices through the touch sensors.

Recently, various functions of the display devices or the applications installed thereon have been provided to users, using pressures generated due to touches as well as touch positions.

The above information disclosed in this Background section is only for understanding of the background of the inventive concepts, and, therefore, it may contain information that does not constitute prior art.

SUMMARY

Display devices constructed according to the principles and exemplary implementations of the invention include a pressure sensor that facilitates functions requiring the location and/or intensity of touch inputs and are capable of reducing the thickness of the display device, which may facilitate flexibility of a foldable device.

According to some implementations, in foldable display devices constructed according to the principles and exemplary implementations of the invention, the durability of the pressure sensor can be improved to reduce or eliminate failure due to bending stresses or fatigue.

Additional features of the inventive concepts will be set forth in the description which follows, and in part will be apparent from the description, or may be learned by practice of the inventive concepts.

According to one aspect of the invention, a display device includes: a display panel; and a sensor disposed on one surface of the display panel to detect external pressure. The sensor includes: a first base substrate having a sensing region and a non-sensing region; a plurality of first conductive patterns extending in a first direction in the sensing region of the first base substrate; a second base substrate facing opposite to the first base substrate; a plurality of second conductive patterns extending in a second direction intersecting the first conductive patterns disposed on a surface of the second base substrate; a pressure sensitive material layer disposed between the first and second conductive patterns, the pressure sensitive material layer having a resistance that varies in response to pressure; and an adhesive layer connecting the first and second base substrate, the adhesive layer being disposed in the same layer as the pressure sensitive material layer.

When external pressure is applied to the sensor, the resistance of the pressure sensitive material layer corresponding to a region in which the pressure is applied may decrease.

The pressure sensitive material layer may include a polymer compound and conductive particles dispersed in the polymer compound.

The pressure sensitive material layer may be disposed along the extending direction of the first conductive patterns in the sensing region. The pressure sensitive material layer may overlap with at least some of the plurality of first conductive patterns.

The adhesive layer may include a first adhesive pattern disposed in the sensing region, and a second adhesive pattern in contact with the first adhesive pattern disposed in the non-sensing region, the second adhesive pattern connecting with the first adhesive pattern. The first adhesive pattern may be disposed between ones of the first conductive patterns or between ones of the second conductive patterns. The first adhesive pattern may be disposed along the extending direction of the first conductive patterns or the second conductive patterns. The second adhesive pattern may be disposed along an edge of the sensing region in the non-sensing region. The first adhesive pattern may have a width smaller than the distance between adjacent second conductive patterns. The first adhesive pattern may have a width equal to the distance between adjacent second conductive patterns.

The adhesive layer may have a thickness smaller than a value obtained by adding the thickness of the first conductive pattern and the thickness of the pressure sensitive material layer. The adhesive layer may include a pressure sensitive adhesive (PSA).

Each of the first and second base substrates may have flexibility and include a flexible region that is foldable.

The first base substrate may include a first flexibility enhancing part formed in the flexible region, and the second base substrate may include a second flexibility enhancing part formed in the flexible region.

The first flexibility enhancing part may be formed on a surface on which the first conductive patterns on the first base substrate and the pressure sensitive material layer are not disposed. The second flexibility enhancing part may be formed on a surface on which the second conductive patterns on the second base substrate are not disposed.

The first flexibility enhancing part may include at least one first discontinuity, and the second flexibility enhancing part may include at least one second discontinuity. The first discontinuity may include a first trench having a shape that is recessed toward the other surface of the first base substrate, on which the first conductive patterns are disposed, from one surface of the first base substrate. The second discontinuity may include a second trench having a shape that is recessed toward the other surface of the second base substrate, on which the second conductive patterns are disposed, from one surface of the second base substrate.

Each of the first trench and the second trench may have a width corresponding to about 2 πn when the curvature of a corresponding bent region is nR (n is a natural number of 1 or more). Each of the first trench and the second trench may be alternately disposed.

The first trench may have a depth that is equal to or smaller than a half of the thickness of the first base substrate, and the second trench may have a depth that is equal to or smaller than a half of the thickness of the second base substrate.

The sensor may be disposed on a surface of the display panel opposite to that surface from which light is emitted.

The pressure sensitive material layer may be disposed between the first and second conductive patterns to fill air in between the first and second conductive patterns.

According to another aspect of the invention, a display device includes: a display panel; a window disposed on a surface from which light of the display panel is emitted; a polarizing film disposed between the display panel and the window; and a sensor disposed on one surface of the display panel. The sensor includes: a first base substrate including a sensing region, a non-sensing region, and a flexible region that is foldable, the first base substrate including a first flexibility enhancing part formed in a flexible region; a plurality of first conductive patterns extending in a first direction in the sensing region of the first base substrate; a second base substrate facing opposite to the first base substrate; a plurality of second conductive patterns extending in a second direction intersecting the first conductive patterns disposed on a surface of the second base substrate; a pressure sensitive material layer disposed between the first and second conductive patterns, the pressure sensitive material layer having a resistance that varies in response to pressure; and an adhesive layer connecting the first and second base substrates, the adhesive layer being disposed in the same layer as the pressure sensitive material layer.

When external pressure is applied to the sensor, the resistance of the pressure sensitive material layer corresponding to a region in which the pressure may be applied decreases, and the pressure sensitive material layer may include a polymer compound and conductive particles dispersed in the polymer compound.

The pressure sensitive material layer may be disposed along the extending direction of the first conductive patterns in the sensing region, and the pressure sensitive material layer may overlap with each first conductive pattern.

The adhesive layer may include a first adhesive pattern disposed in the sensing region, and a second adhesive pattern disposed in the non-sensing region, the second adhesive pattern may connect with the first adhesive pattern.

The first adhesive pattern may be disposed between and spaced part from adjacent first conductive patterns or between spaced part from adjacent second conductive patterns.

The first adhesive pattern may be disposed along the extending direction of the first conductive patterns or the second conductive pattern, and the second adhesive pattern may be disposed along an edge of the sensing region in the non-sensing region.

The sensor may be disposed on a surface from which light of the display panel is not emitted.

The first flexibility enhancing part may be provided on a surface on which the first conductive patterns on the first base substrate and the pressure sensitive material layer are not disposed.

The second base substrate may further include a second flexibility enhancing part formed in one region corresponding to the flexible region of the first base substrate, and the second flexibility enhancing part may be formed on a surface on which the second conductive patterns on the second base substrate are not disposed.

The first flexibility enhancing part may include at least one first discontinuity, and the second flexibility enhancing part may include at least one second discontinuity.

The first discontinuity may include a first trench having a shape that is recessed toward the other surface of the first base substrate, on which the first conductive patterns are disposed, from one surface of the first base substrate, and the second discontinuity may include a second trench having a shape that is recessed toward the other surface of the second base substrate, on which the second conductive patterns are disposed, from one surface of the second base substrate.

The display device may further include a cushion layer disposed on a surface from which light from the display panel is not emitted, the cushion layer including an elastically deformable material.

The cushion layer may include a first surface corresponding to the surface from which light from the display panel is not emitted and a second surface opposite to the first surface, and the sensor may be disposed on the second surface of the cushion layer.

The sensor may be disposed between the surface from which light from the display panel is emitted and the polarizing film.

The polarizing film may include a first surface corresponding to the surface from which light from the display panel is emitted and a second surface opposite to the first surface, and the sensor may be disposed between the second surface of the polarizing film and the window.

The window may include a first surface corresponding to the surface from which light from the display panel is emitted and a second surface opposite to the first surface, and the sensor may be disposed on the second surface of the window.

The first flexibility enhancing part may include at least one trench having a shape that is recessed toward the other surface of the first base substrate, on which the first conductive patterns are disposed, from one surface of the first base substrate, which corresponds to the second surface of the window It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 10A and 10B are plan views illustrating a pressure sensor according to another exemplary embodiment.

FIG. 10C is a plan view illustrating the pressure sensor including a first base substrate of FIG. 10A and a second base substrate of FIG. 10B.

DETAILED DESCRIPTION

Figure 1:
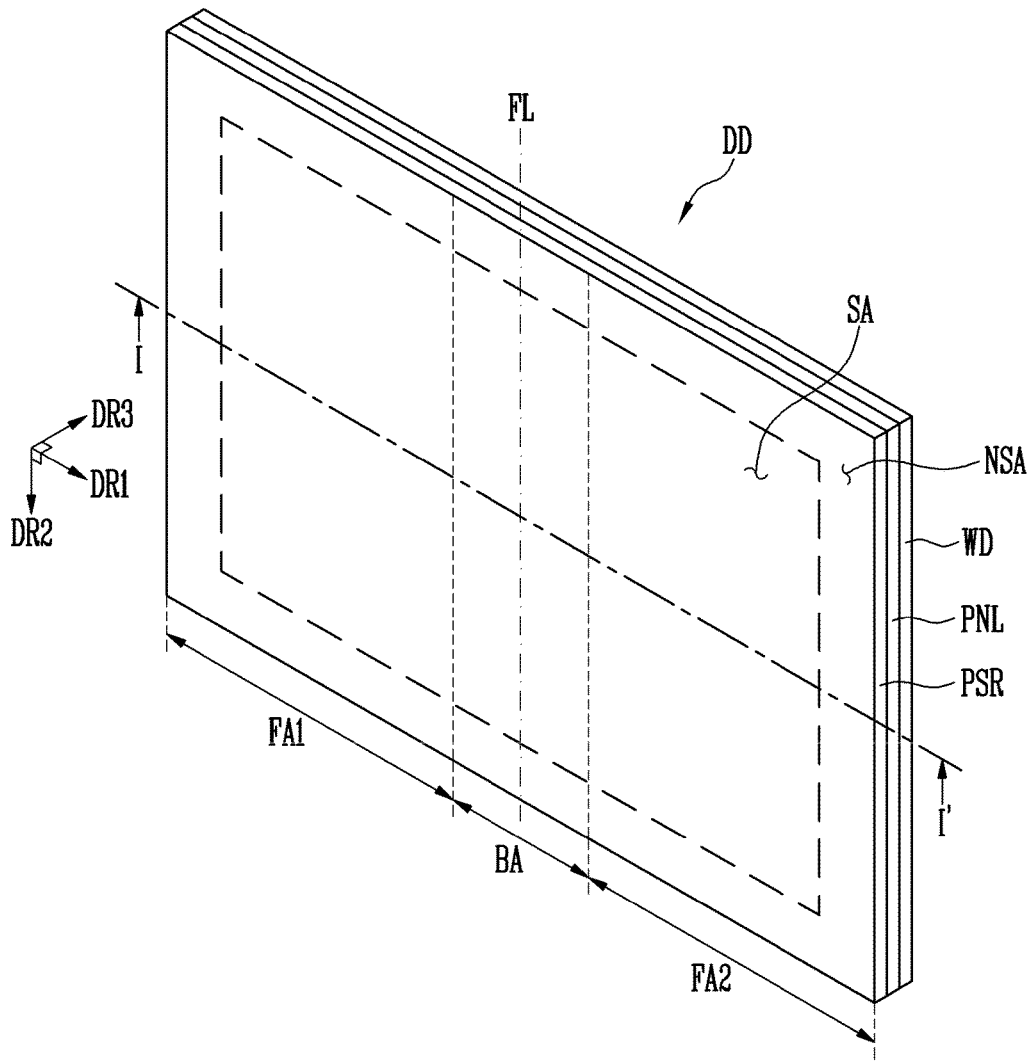
FIG. 1 is a perspective view of an exemplary embodiment of a display device including a pressure sensor constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Figure 2:
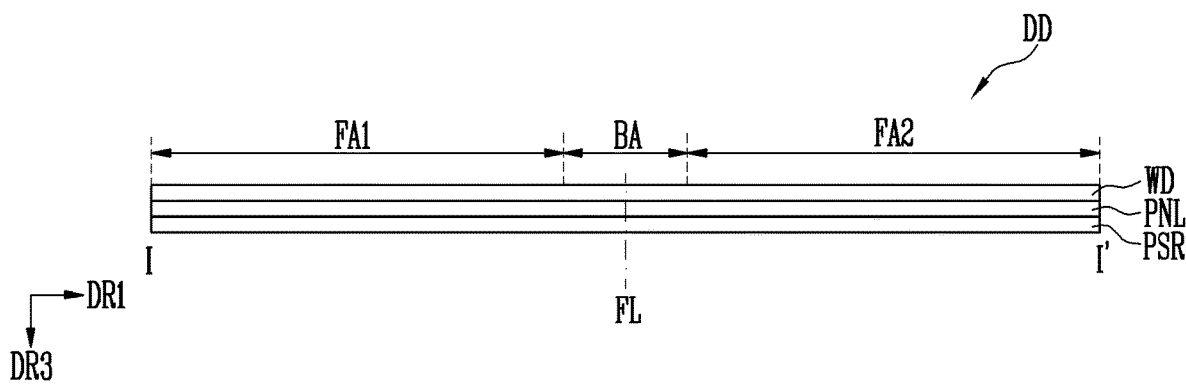
FIG. 2 is a cross-sectional view taken along line I-I' of FIG. 1.
Figure 3:
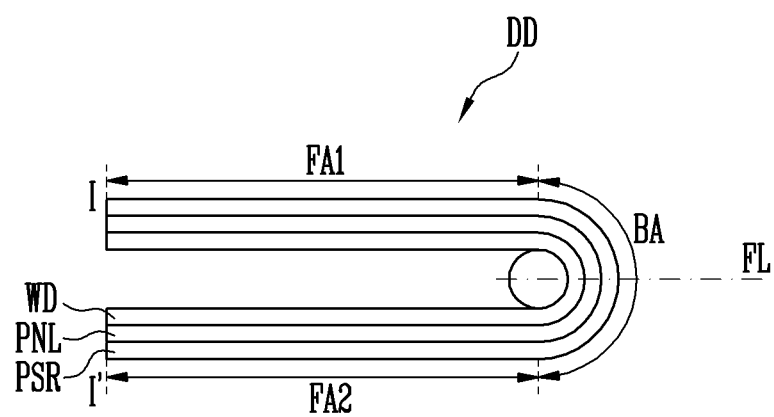
FIG. 3 is a cross-sectional view of the display device of FIG. 1 when the display device is folded.

FIG. 1 is a perspective view of an exemplary embodiment of a display device including a pressure sensor constructed according to the principles of the invention. FIG. 2 is a cross-sectional view taken along line I-I' of FIG. 1. FIG. 3 is a cross-sectional view of the display device of FIG. 1 when the display device is folded.

Referring to FIGS. 1 to 3, the display device DD may include a pressure sensor PSR, a display panel PNL, and a window WD.

The display device DD may be provided in various shapes. For example, the display device DD may be provided in a rectangular plate shape having two pairs of sides substantially parallel to each other. When the display device DD is provided in the rectangular plate shape, any one pair of sides among the two pairs of sides may be longer than the other pair of sides.

In an exemplary embodiment, a case where the display device DD has a pair of long sides and a pair of short sides is illustrated for convenience of description. In this case, the extending direction of the long sides is represented as a first direction DR1, the extending direction of the short sides is represented as a second direction DR2, and the direction perpendicular to the extending direction of the long sides and the extending direction of the short sides is represented as a third direction DR3.

At least a portion of the display device DD of the illustrated embodiment may have flexibility, and the display device DD may be folded at the portion having flexibility. That is, the display device DD may include a bent region BA that has flexibility and is bendable, and a flat region FA1 and FA2 that is provided at at least one side of the bent region BA and is flat without being folded. The flat region FA1 and FA2 may include a first flat region FA1 and a second flat region FA2, which are spaced apart from each other with the bent region BA interposed therebetween. The first and second flat regions FA1 and FA2 may have or not have flexibility.

In the illustrated embodiment, the first flat region FA1, the bent region BA, and the second flat region FA2 are sequentially arranged along the first direction DR1, but the inventive concepts are not limited thereto. The bent region BA may extend along the second direction DR2.

When a center line about which the display device DD is folded is a folding line FL, the folding line FL may be provided in plurality, and be provided in the bent region BA. In the illustrated embodiment, it the folding line FL passes through the center of the bent region BA, and the bent region BA is axially symmetric with respect to the folding line FL, but the inventive concepts are not limited thereto. For example, the folding line FL may be asymmetrically provided in the bent region BA. The bent region BA and the folding line FL may overlap with a display region in which an image is displayed in the display panel PNL. When the display device DD is folded, the display region may be folded.

The term "folded" as used herein does not mean a fixed shape but means a shape deformable into another shape from the original shape, and includes a shape folded, curved, or rolled like a roll along one or more specific lines, i.e., one or more folding lines. Therefore, in an exemplary embodiment, a state in which the display device DD is folded such that one surfaces of the first and second flat regions FA1 and FA2 are located substantially parallel to each other and are folded to face each other is illustrated. However, the inventive concepts are not limited thereto. For example, the display device DD may be folded such that the surfaces of the first and second flat regions FA1 and FA2 form a predetermined angle (e.g., an acute angle, a right angle, or an obtuse angle) with the bent region BA interposed therebetween.

Also, in the bent region BA and the first and second flat regions FA1 and FA2, the expression "having flexibility" or "having no flexibility" is a term that relatively represents a property of the display device DD. That is, the expression "having no flexibility" may include not only a case of being hard without having flexibility at all but also a case having flexibility smaller than that of the bent region BA even when the flexibility exists. Therefore, the first and second flat regions FA1 and FA2 may have relatively less flexibility than that of the bent region BA or have no flexibility. The first and second flat regions FA1 and FA2 may not be folded even under a condition in which the bent region BA is folded.

In the illustrated display device DD, since the folding line FL is provided in the bent region BA, the display device DD may be folded in the bent region BA.

The case where the first and second flat regions FA1 and FA2 have similar areas, and the bent region BA is located between the first and second flat regions FA1 and FA2 is illustrated for convenience of description, but the inventive concepts are not limited thereto. For example, the first and second flat regions FA1 and FA2 may have areas different from each other. In addition, two flat regions FA1 and FA2 each including the first and second flat regions FA1 and FA2 are not to be provided. In some embodiments, one or three or more flat regions may be provided. In this case, a plurality of spaced apart flat regions may be provided with the bent region BA interposed therebetween.

The display panel PNL may display arbitrary visual information, e.g., a text, a video, a picture, a two-dimensional or three-dimensional image, etc. Hereinafter the arbitrary visual information is referred to as an "image." The kind of the display panel PNL is not particularly limited to ones that display the image. For example, self-luminescent display panels such as an organic light emitting display panel (OLED panel) may be used as the display panel PNL. In addition, non-luminescent display panel such as a liquid crystal display panel (LCD panel), an electrophoretic display panel (EPD panel), and an electro-wetting display panel (EWD panel) may be used as the display panel PNL. When a non-luminescent display panel is used as the display panel PNL, the display device may include a backlight unit that supplies light to the display panel PNL.

The display panel PNL may include the display region in which the image is displayed and a non-display region provided at at least one side of the display region. For example, the non-display region may be provided in a shape surrounding the display region.

The pressure sensor PSR may be disposed on a back surface of the display panel PNL, i.e., a surface on which the image is not displayed, and recognize a touch event from the display device DD through a finger of a user or a separate input means. In an exemplary embodiment, the pressure sensor PSR may sense a position of the touch event and an intensity of the pressure at the position.

The pressure sensor PSR may include a sensing region SA in which a touch of the user occur and a non-sensing region NSA provided at at least one side of the sensing region SA. The non-sensing region NSA may be provided in a shape surrounding the sensing region SA. Here, the sensing region SA may correspond to the display region of the display panel PNL, and the non-sensing region NSA may correspond to the non-display region of the display panel PNL.

The pressure sensor PSR may include first and second conductive patterns and a pressure sensitive material layer that is disposed between the first and second conductive patterns and has a resistance changed depending on a touch pressure of the user. The pressure sensor PSR will be described later with reference to FIG. 4.

Each of the display panel PNL and the pressure sensor PSR in the display device DD may have the flat region FA1 and FA2 and the bent region BA. The bent region BA of the display panel PNL may correspond to the bent region BA of the pressure sensor PSR, and the flat region FA1 and FA2 of the display panel PNL may correspond to the flat region FA1 and FA2 of the pressure sensor PSR.

The window WD for protecting an exposed surface of the display panel PNL may be disposed on the display panel PNL. The window WD allows an image from the display panel PNL to be transmitted therethrough and simultaneously reduces shock from the outside, so that it is possible to prevent the display panel PNL from being damaged or erroneously operated due to external forces.

Figure 4:
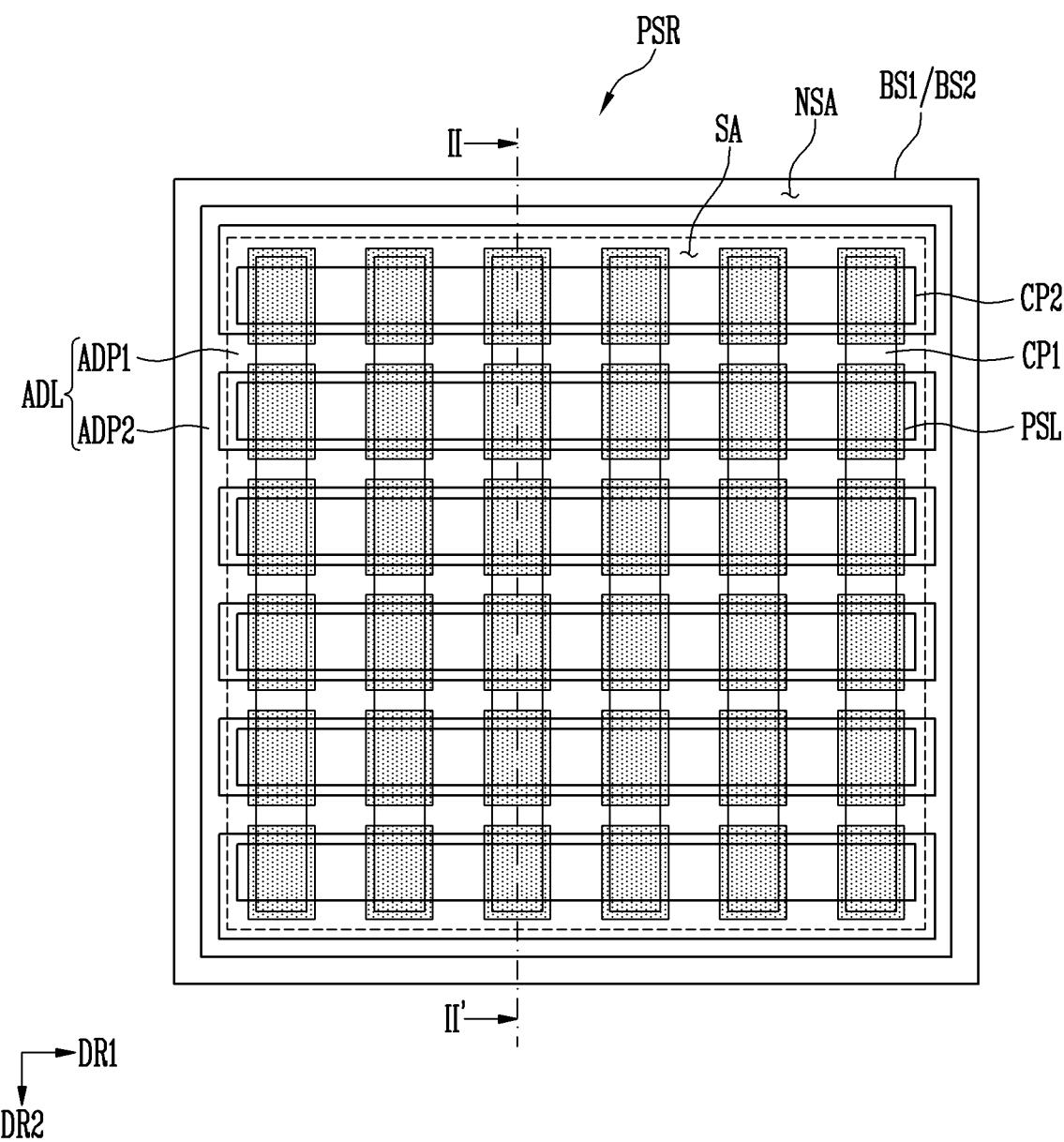
FIG. 4 is a plan view schematically illustrating the pressure sensor of FIG. 1.
Figure 5:
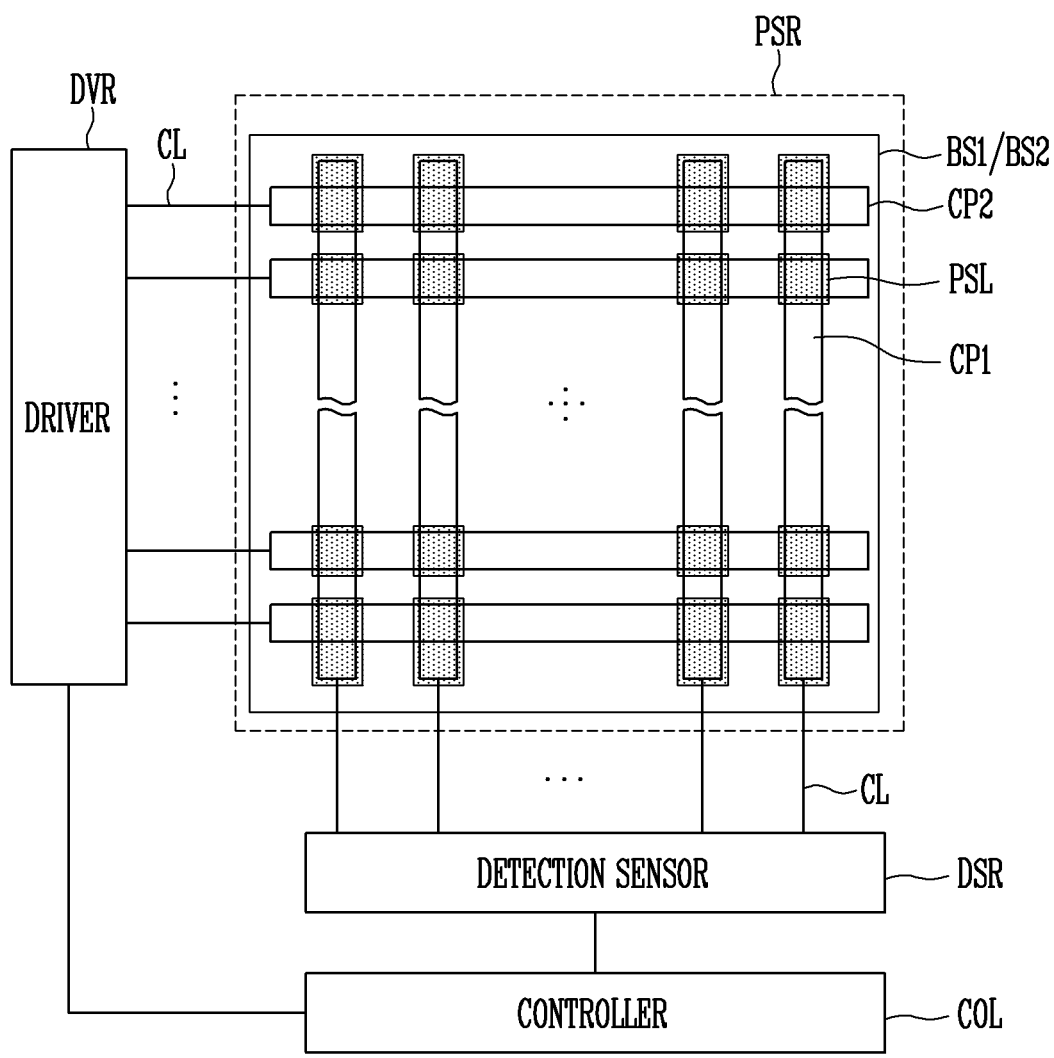
FIG. 5 is a schematic diagram of the pressure sensor of FIG. 4.
Figure 6:
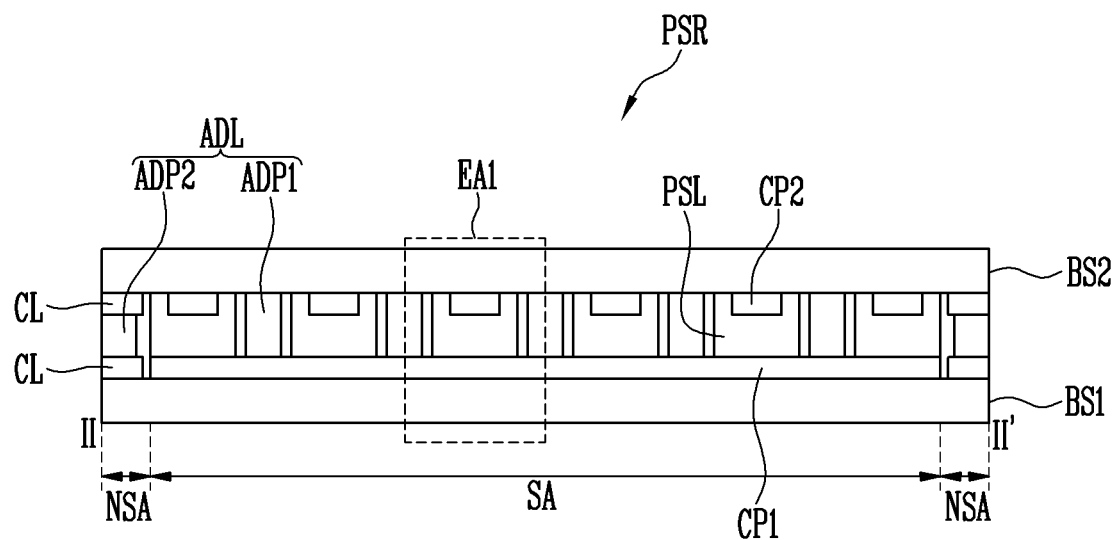
FIG. 6 is a cross-sectional view taken along line II-II' of FIG. 4.
Figure 7:
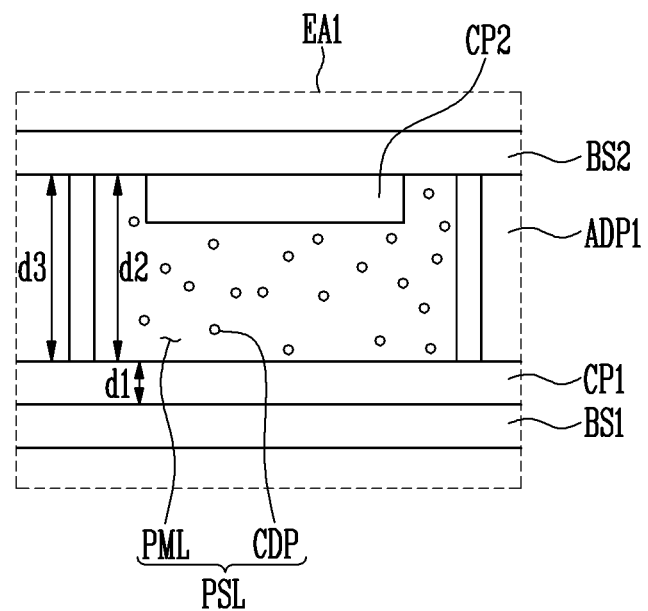
FIG. 7 is an enlarged view corresponding to region EA1 of FIG. 6 when pressure is not applied to the pressure sensor.
Figure 8:
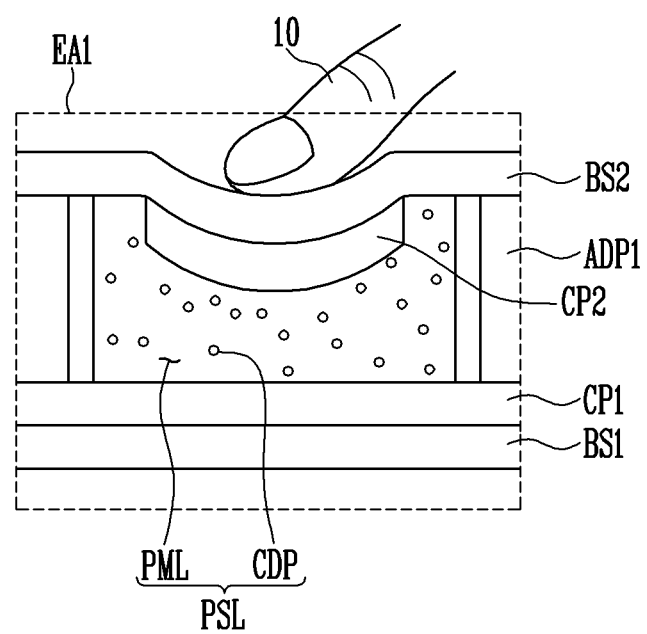
FIG. 8 is an enlarged view corresponding to the region EA1 of FIG. 6 when pressure is applied to the pressure sensor.

FIG. 4 is a plan view schematically illustrating the pressure sensor of FIG. 1. FIG. 5 is a schematic diagram of the pressure sensor of FIG. 4. FIG. 6 is a cross-sectional view taken along line II-IF of FIG. 4. FIG. 7 is an enlarged view corresponding to region EA1 of FIG. 6 when pressure is not applied to the pressure sensor. FIG. 8 is an enlarged view corresponding to the region EA1 of FIG. 6 when pressure is applied to the pressure sensor. In FIG. 5, the illustration of an adhesive layer included in the pressure sensor is omitted for convenience of description.

Referring to FIGS. 1 to 8, the display device DD according to the illustrated embodiment may include a pressure sensor PSR, a driving unit DVR, a sensing unit DSR, and a controller COL. The display device DD may be deformed in various shapes such that at least a portion of the display device DD is curved, folded, rolled, or the like. To this end, at least some of components constituting the display device DD may have flexibility.

The pressure sensor PSR may include a first base substrate BS1, a plurality of first conductive patterns CP1, a second base substrate BS2, and a plurality of second conductive patterns CP2.

The first base substrate BS1 may include a sensing region SA and a non-sensing region NSA. For convenience of description, the sensing region SA of the first base substrate BS1 is referred to as a first sensing region SA, and the non-sensing region NSA of the first base substrate BS1 is referred to as a first non-sensing region NSA.

In an exemplary embodiment, the first base substrate BS1 may be made of a material having flexibility to be bendable or foldable, and have a single- or multi-layered structure.

For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the first base substrate BS1 may be variously changed, and the first base substrate BS1 may be made of a fiber reinforced plastic (FRP), etc.

The first conductive patterns CP1 may be disposed on the first base substrate BS1. Specifically, the first conductive patterns CP1 may be provided in the first sensing region SA, extend along a second direction DR2, and be repeatedly arranged substantially parallel to each other. In the first sensing region SA, each first conductive pattern CP1 may be spaced apart from an adjacent first conductive pattern CP1.

The first conductive patterns CP1 may include a conductive material. The conductive material may include metals or alloys thereof. The metals may include gold (Au), silver (Ag), aluminum (Al), molybdenum (Mo), chromium (Cr), titanium (Ti), nickel (Ni), neodymium (Nd), copper (Cu), platinum (Pt), and the like. Also, the first conductive patterns CP1 may include a transparent conductive material. The transparent conductive material may include silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nano tube, graphene, and the like.

The second base substrate BS2 may include the same material as the first base substrate BS1. The second base substrate BS2 may include a sensing region SA and a non-sensing region NSA. The sensing region SA of the second base substrate BS2 may correspond to the first sensing region SA, and the non-sensing region NSA of the second base substrate BS2 may correspond to the first non-sensing region NSA. For convenience of description, the sensing region SA included in the second base substrate BS2 is referred to as a second sensing region SA, and the non-sensing region NSA included in the second base substrate BS2 is referred to as a second non-sensing region NSA.

The second conductive patterns CP2 may be disposed on the second base substrate BS2. Specifically, the second conductive patterns CP2 may be provided in the second sensing region SA, extend along a first direction DR1 intersecting the second direction DR2, and be repeatedly arranged in parallel to each other. In the second sensing region SA, each second conductive pattern CP2 may be spaced apart from an adjacent second conductive pattern CP2. The second conductive patterns CP2 may include a conductive material. The second conductive patterns CP2 may include the same material as the first conductive patterns CP1 or include a material different from that of the first conductive patterns CP1.

In an exemplary embodiment, one of the first conductive pattern CP1 and the second conductive pattern CP2 may be a driving electrode that receives a driving signal applied from the driving unit DVR through a corresponding connection line CL, and the other of the first conductive pattern CP1 and the second conductive pattern CP2 may be a receiving electrode that transfers a touch pressure sensing signal to the sensing unit DSR through a corresponding connection line CL. In an exemplary embodiment, the first conductive patterns CP1 may be receiving electrodes, and the second conductive patterns CP2 may be driving electrodes. Here, the driving signal may be a signal for sensing a touch pressure of a user.

The driving unit DVR may apply the driving signal to the second conductive patterns CP2. For example, the driving unit DVR may sequentially apply the driving signal to the second conductive patterns CP2. Also, the driving unit DVR may simultaneously apply the driving signal to the second conductive patterns CP2.

The sensing unit DSR may receive the touch pressure sensing signal from the first conductive patterns CP1. The touch pressure sensing signal may include information on a position at which the pressure is applied and information on a voltage value or current value output from the first conductive patterns CP1.

The controller COL may generate a driving control signal and then transfer the driving control signal to the driving unit DVR. The driving unit DVR receiving the driving control signal may translate the driving control signal to a driving signal of the second conductive patterns CP2, and transfer the driving signal to the second conductive patterns CP2.

Also, the controller COL may generate a sensing control signal and then transfer the sensing control signal to the sensing unit DSR. The sensing unit DSR may receive the touch pressure signal transferred from the first conductive patterns CP1 in response to the sensing control signal.

Meanwhile, the pressure sensor PSR may further include a pressure sensitive material layer PSL and an adhesive layer ADL, which are disposed between the first base substrate BS1 and the second base substrate BS2.

The pressure sensitive material layer PSL is a component having an electrical characteristic that is changed depending on the degree of deformation thereof, and the resistance of the pressure sensitive material layer PSL may be changed depending on external pressure applied between the first conductive patterns CP1 and the second conductive patterns CP2. That is, the resistance of the pressure sensitive material layer PSL may be changed depending on the amount of external pressure applied to the pressure sensor PSR. For example, the resistance of the pressure sensitive material layer PSL may decrease as the pressure increases. In particular, when the pressure is not applied to the display device DD, the resistance of the pressure sensitive material layer PSL considerably increases, and therefore, the pressure sensitive material layer PSL may be in an electrically open state.

In an exemplary embodiment, the pressure sensitive material layer PSL may include a polymer material layer PML and conductive particles CDP uniformly dispersed in the polymer material layer PML.

The conductive particle CDP may include particles of a metalloid, a metal, a conductive oxide of the metalloid or the metal, and a conductive nitride of the metalloid or the metal, or include particles in a core shell structure, in which the particles are coated on an insulating bead, or a combination thereof. The metalloid may include any one of antimony (Sb), germanium (Ge), and arsenic (As), or an alloy thereof. The metal may include a zinc (Zn), aluminum (Al), scandium (Sc), chrome (Cr), manganese (Mn), iron (Fe), cobalt (Co), nickel (Ni), copper (Cu), indium (In), tin (Sn), yttrium (Y), zirconium (Zr), niobium (Nb), molybdenum (Mo), ruthenium (Ru), rhodium (Rh), palladium (Pd), gold (Au), silver (Ag), platinum (Pt), strontium (Sr), tungsten (W), cadmium (Cd), tantalum (Ta), titanium (Ti), or an alloy thereof. The conductive oxide may include an indium tin oxide (ITO), an indium zinc oxide (IZO), an aluminum doped zinc oxide (AZO), a gallium indium zinc oxide (GIZO), a zinc oxide (ZnO), and a mixture thereof.

In an exemplary embodiment, the conductive particle CDP may include metal particles, but the inventive concepts are not limited thereto. The conductive particle CDP may have a diameter of about 100 nm to about 1000 nm.

The polymer material layer PML may be a polymer resin including a material that has elasticity to be elastically deformed according to a touch of the user. In an exemplary embodiment, the material having elasticity may be deformed by external pressure (e.g., a pressure applied by a finger of a user, a stylus pen, etc.), and may have elasticity that enables the material to return to the original state when the external pressure is eliminated. The polymer material layer PML may include any one selected from polycarbonate (PC), polymethyl methacrylate (PMMA), polyimide (PI), polyethylene terephthalate (PET), polypropylene terephthalate (PPT), amorphous polyethylene terephthalate (APET), polyethylene naphthalate (PEN), polyethylene terephthalate glycol-modified (PETG), tri-acetyl cellulose (TAC), cyclic olefin polymer (COP), cyclic olefin copolymer (COC), polydicyclopentadiene (DCPD), cyclopentadiene anions (CPD), polyarylate (PAR), polyether sulfone (PES), polyether imide (PEI), modified epoxy resin, and acrylic resin, or any combination of two or more thereof. In an exemplary embodiment, the polymer material layer PML may include polymethyl methacrylate (PMMA).

The pressure sensitive material layer PSL formed from the polymer material layer PML in which the conductive particles CDP are uniformly dispersed may be applied onto the first conductive patterns CP1, using a screen printing method, or the like.

In an exemplary embodiment, the pressure sensitive material layer PSL may be provided between the first and second conductive patterns CP1 and CP2 to fill in a space between the first and second conductive patterns CP1 and CP2. That is, the pressure sensitive material layer PSL may fill in a space between the first and second conductive patterns CP1 and CP2 to remove an air gap that may exist in the space.

If a touch occurs as a finger 10 of a user is in contact with the pressure sensor PSR as shown in FIG. 8, a pressure may be applied to the pressure sensor PSR. The substrate in the direction in which the pressure is applied, e.g., the second base substrate BS2 may be deformed. If the second base substrate BS2 is deformed, the distance between the second conductive patterns CP2 and the first conductive patterns CP1 may be reduced.

Also, if the pressure is applied to the pressure sensor PSR, the electrical characteristic, i.e., the resistance of the pressure sensitive material layer PSL, which corresponds to the region to which the pressure is applied, decreases. In addition, as the pressure sensitive material layer PSL is deformed, the distance between the second conductive patterns CP2 and the first conductive patterns CP1 may be reduced. In particular, if the resistance of the pressure sensitive material layer PSL decreases, a current flows between the second conductive patterns CP2 and the first conductive patterns CP1, where the distance is reduced. The pressure sensor PSR may sense an intensity of a touch pressure of the user, which is applied to the pressure sensor PSR using the current flowing between the first and second conductive patterns CP1 and CP2. At the same time, the pressure sensor PSR may sense a touch position of the user.

The adhesive layer ADL may include a first adhesive pattern ADP1 and a second adhesive pattern ADP2.

The first adhesive pattern ADP1 may be provided in the first and second sensing regions SA, and the second adhesive pattern ADP2 may be provided in the first and second non-sensing region NSA. In an exemplary embodiment, the first and second adhesive patterns ADP1 and ADP2 may be in contact with each other to be connected to each other. For example, the first adhesive pattern ADP1 may be provided in the first and second sensing regions SA in the shape extending from the second adhesive pattern ADP2. The first adhesive pattern ADP1, as shown in FIG. 4, may be provided in the first and second sensing regions SA to extend along the first direction DR1 and be provided between two adjacent second conductive patterns CP2.

The first and second adhesive patterns ADP1 and ADP2 may be disposed between the first base substrate BS1 and the second base substrate BS2 to allow the first and second base substrates BS1 and BS2 to be adhered to each other. Also, the first and second adhesive patterns ADP1 and ADP2 may additionally remove an air gap remaining in a space between the first and second base substrates BS1 and BS2.

In an exemplary embodiment, the first adhesive pattern ADP1 may have a thickness d3 smaller than a value obtained by adding the thickness d1 of the first conductive pattern CP1 and the thickness d2 of the pressure sensitive material layer PSL. For example, when the value obtained by adding the thickness d1 of the first conductive pattern CP1 and the thickness d2 of the pressure sensitive material layer PSL is 12 μm, the first adhesive pattern ADP1 may have a thickness d3 of about 10 μm.

When viewed in plan, one first adhesive pattern ADP1 may be disposed between two adjacent second conductive patterns CP2. The first adhesive pattern ADP1 may have a width smaller than the distance between the two adjacent second conductive patterns CP2 by considering an attachment tolerance, etc., but the inventive concepts are not limited thereto. For example, the first adhesive pattern ADP1 may have a width equal to the distance between the two adjacent second conductive patterns CP2. In this case, the first adhesive pattern ADP1 may fill between the two adjacent second conductive patterns CP2.

When viewed in plan, the second adhesive pattern ADP2 may have a shape extending along edges of the first and second sensing regions SA.

In an exemplary embodiment, the adhesive layer ADL may include a pressure sensitive adhesive (PSA) including an adhesive material that reacts when a pressure for allowing the adhesive layer ADL to be adhered to an adhesive surface is applied. When the adhesive layer ADL includes the PSA, the adhesive layer ADL may be attached to the adhesive surface, using only a pressure, without separate heat treatment or UV treatment at a normal temperature.

Figure 9A:
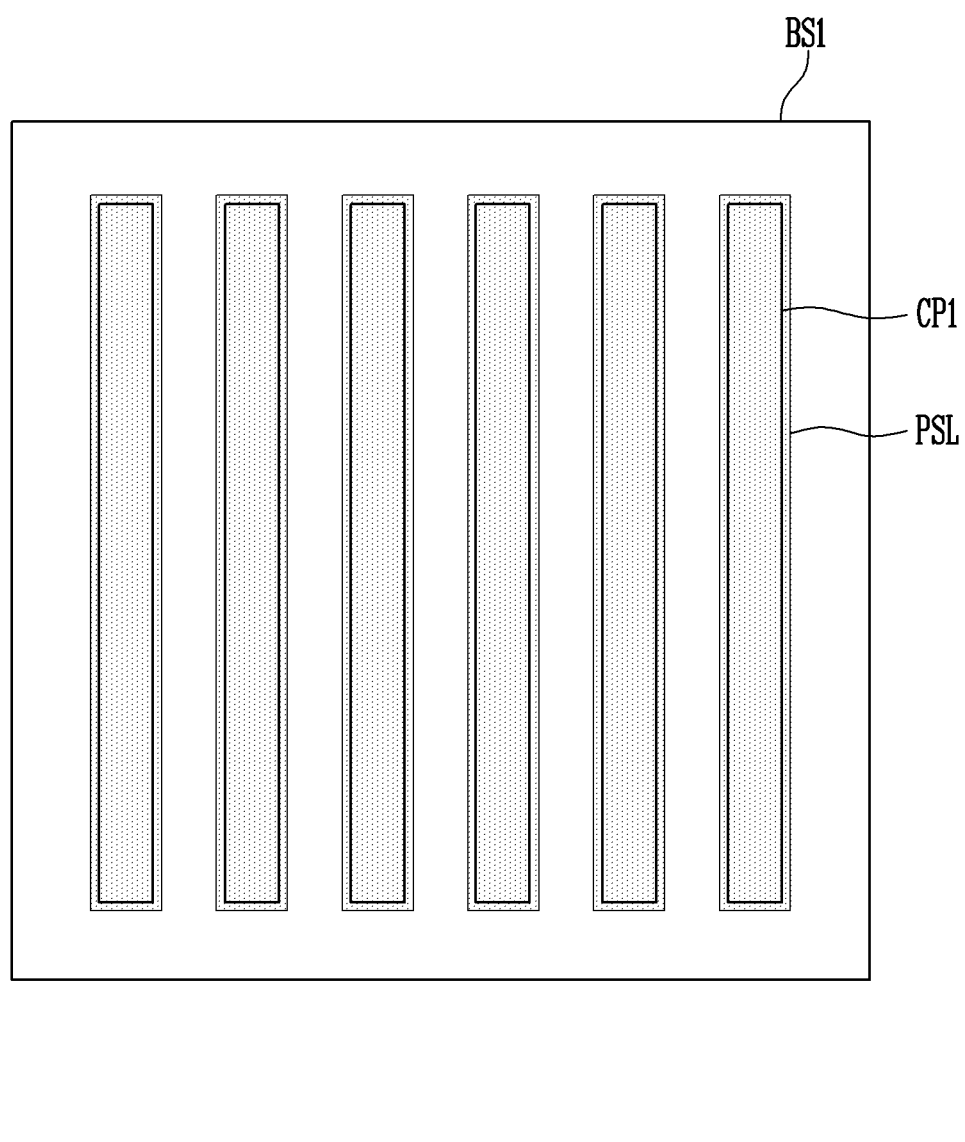
FIGS. 9A and 9B are plan views illustrating a pressure sensor according to an exemplary embodiment.
Figure 9B:
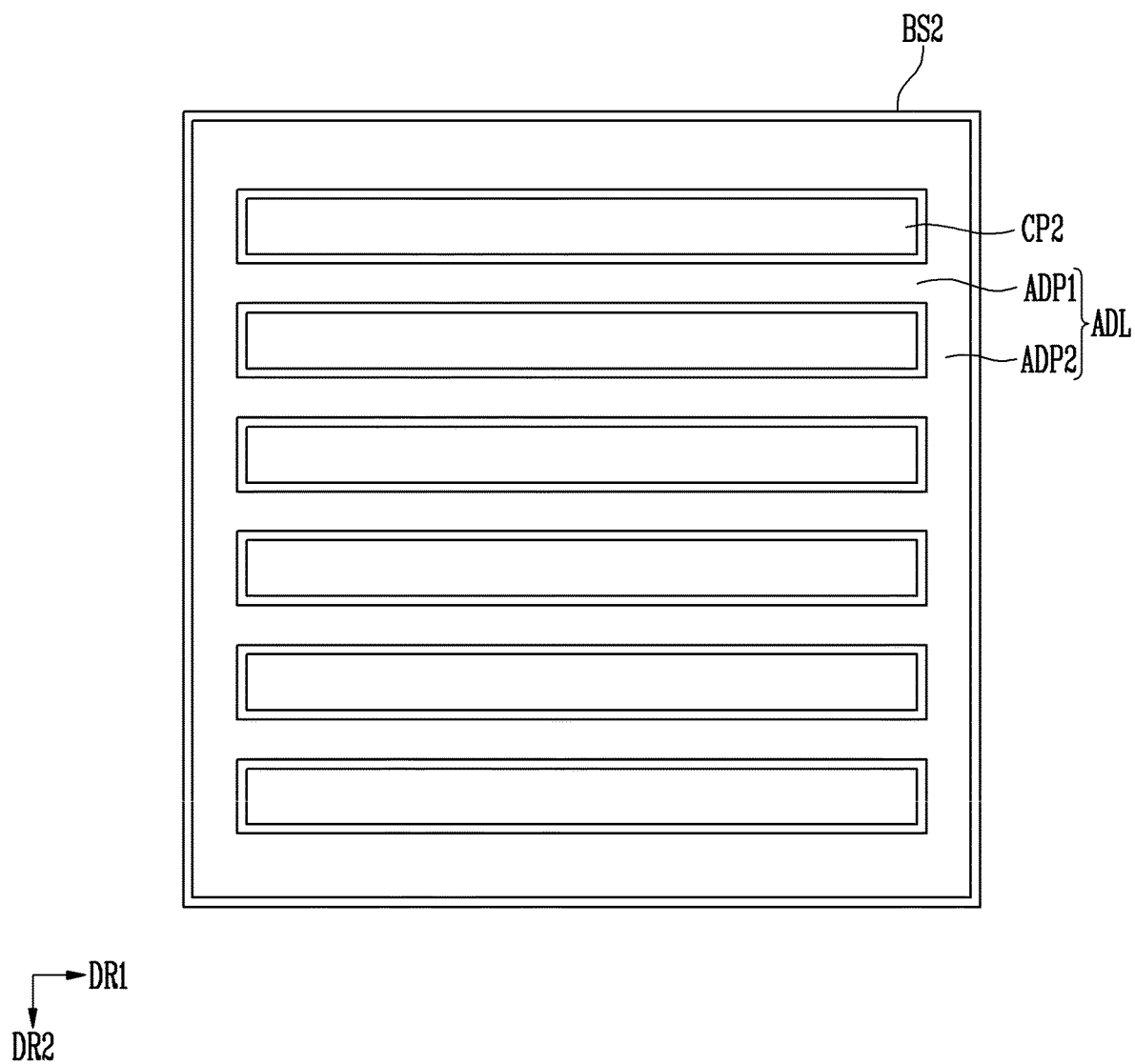
Figure 10B:
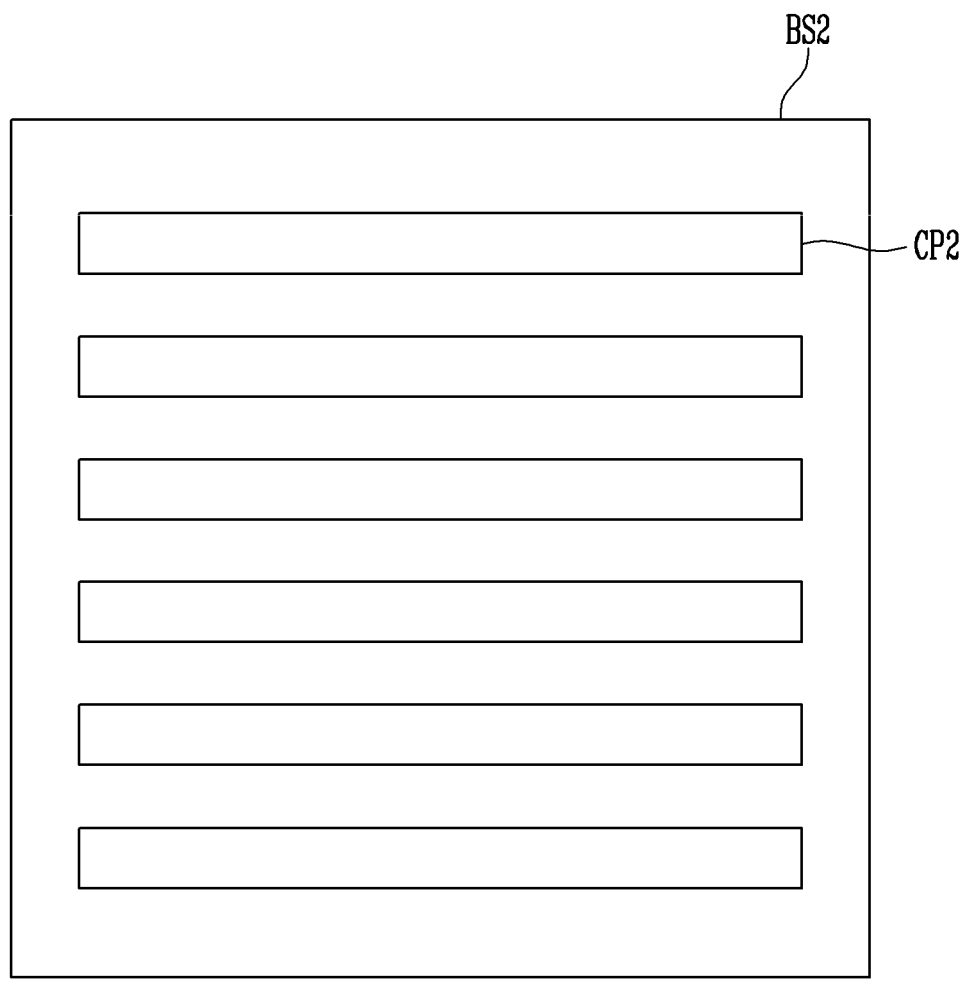
Figure 10D:
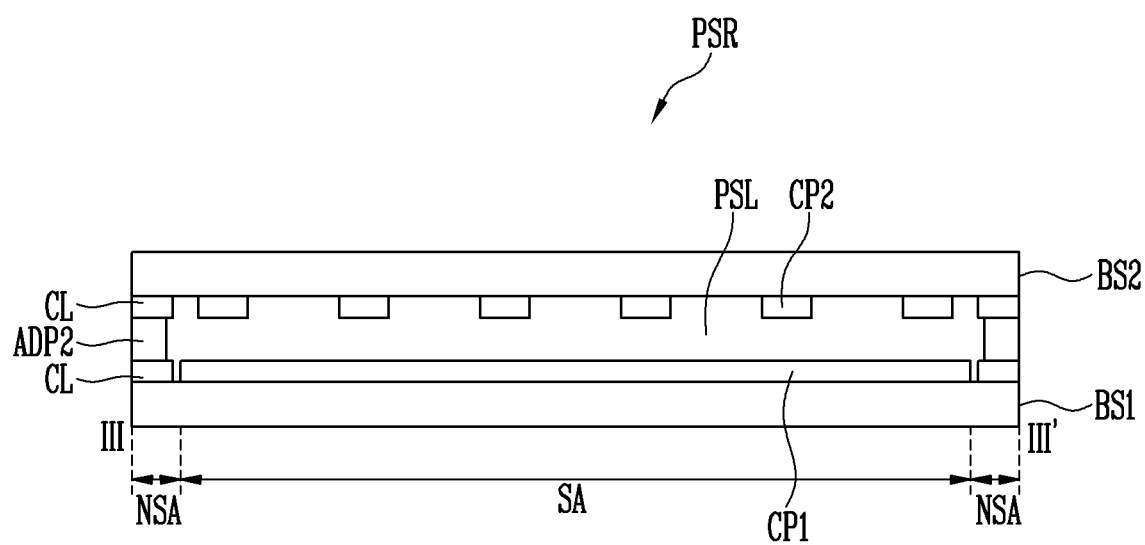
FIG. 10D is a cross-sectional view taken along line of FIG. 10C.
Figure 11:
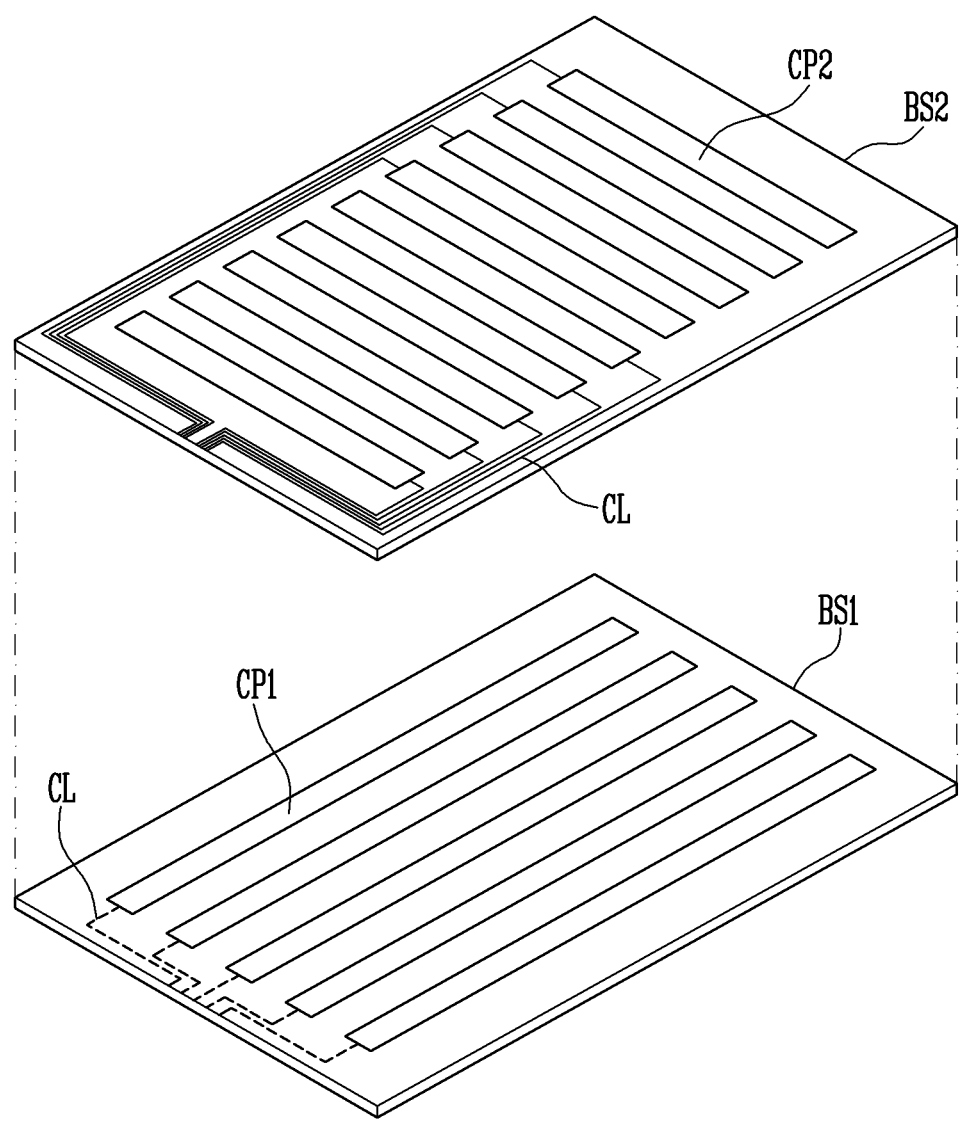
FIG. 11 is a perspective view of the first and second conductive patterns shown in FIG. 4.
Figure 12:
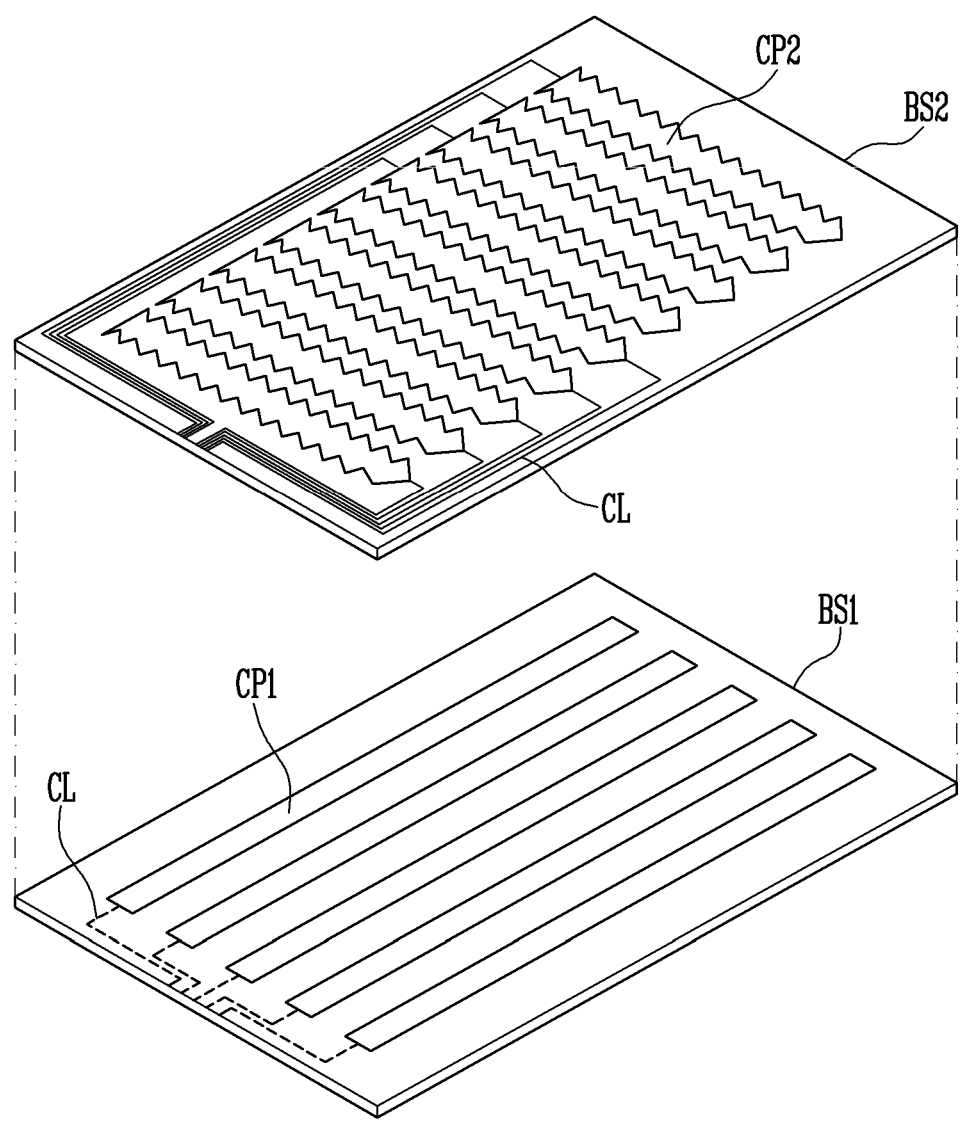
FIG. 12 is a perspective view of another exemplary embodiment of the first and second conductive patterns shown in FIG. 4.

FIGS. 9A and 9B are plan views illustrating a pressure sensor according to an exemplary embodiment. FIGS. 10A and 10B are plan views illustrating a pressure sensor according to another exemplary embodiment. FIG. 10C is a plan view illustrating the pressure including a first base substrate of FIG. 10A and a second base substrate of FIG. 10B. FIG. 10D a cross-sectional view taken along line of FIG. 10C. FIG. 11 is a perspective view of the first and second conductive patterns shown in FIG. 4. FIG. 12 is a perspective view of another exemplary embodiment of the first and second conductive patterns shown in FIG. 4.

Referring to FIGS. 4, 9A, 9B, 10A, 10B, 10C, 10D, 11, and 12, the pressure sensor PSR according to the illustrated embodiments may include a first base substrate BS1, a plurality of first conductive patterns CP1 and a pressure sensitive material layer PSL, which are disposed on the first base substrate BS1, a second base substrate BS2, and a plurality of second conductive patterns CP2 and an adhesive layer ADL, which are disposed on the second base substrate BS2.

In an exemplary embodiment, the first conductive patterns CP1 may extend along a second direction DR2, and be disposed on the first base substrate BS1 such that each of the first conductive patterns CP1 is spaced apart from an adjacent first conductive pattern CP1 at a certain distance. As shown in the drawings, the first conductive patterns CP1 may have a stripe (column-like) shape. However, the inventive concepts are not limited thereto, and the first conductive patterns CP1 may have various shapes. For example, the first conductive patterns CP1 may have irregular or regular shapes such as a polygonal shape including a quadrangular shape like a rhombus. Each of the first conductive patterns CP1 may be connected to the sensing unit (see DSR of FIG. 5) through a corresponding connection line CL.

The pressure sensitive material layer PSL may be applied onto a corresponding first conductive pattern CP1 and cover the first conductive pattern CP1. When viewed in plan, the pressure sensitive material layer PSL may overlap with the first conductive pattern CP1.

In an exemplary embodiment, the second conductive patterns CP2 may extend along a first direction DR1 intersecting the second direction DR2, and be disposed on the second base substrate BS2 such that each of the second conductive patterns CP2 is spaced apart from an adjacent second conductive pattern CP2 at a certain distance.

As shown in the drawings, like the first conductive patterns CP1, the second conductive patterns CP2 may have a stripe (column-like) shape. However, the inventive concepts are not limited thereto, and the second conductive patterns CP2 may have various shapes. For example, the second conductive patterns CP2 may have irregular or regular shapes such as a polygonal shape including a quadrangular like a rhombus. In some embodiments, the second conductive patterns CP2 may have a polygonal shape including a plurality of projections protruding in one direction as shown in FIG. 12. In this case, the second conductive patterns CP2 may have a shape more complicated than that of the first conductive patterns CP1. If the second conductive patterns CP2 have a complicated shape, it is possible to reduce visibility of the first conductive patterns CP1, the pressure sensitive material layer PSL, and the like, which are disposed under the second conductive patterns CP2, from the outside, which is undesirable.

The adhesive layer ADL may include a first adhesive pattern ADP1 provided in a sensing region SA of the second base substrate BS2 and a second adhesive pattern ADP2 provided in a non-sensing region NSA of the second base substrate BS2. The first adhesive pattern ADP1 may extend in the extending direction of the second conductive patterns CP2, and be spaced apart from an adjacent second conductive pattern CP2 at a certain distance. The first adhesive pattern ADP1 may extend from the second adhesive pattern ADP2 to the sensing region SA.

The adhesive layer ADL, as shown in FIG. 9B, does not overlap with the second conductive patterns CP2 when viewed in plan. When the first base substrate BS1 and the second base substrate BS2 are combined together using the adhesive layer ADL, the first adhesive pattern ADP1 and the first conductive patterns CP1 may partially overlap with each other in regions in which they intersect each other, and the first adhesive pattern ADP1 and the second conductive patterns CP2 may not overlap with each other.

In the above-described embodiment, it is illustrated that the adhesive layer ADL is disposed on the second base substrate BS2, but the inventive concepts are not limited thereto.

In some embodiments, the adhesive layer ADL may be disposed on the first base substrate BS1 as shown in FIGS. 10A, 10C and 10D. In this case, the first adhesive pattern ADP1 of the adhesive layer ADL may extend in the extending direction of the first conductive patterns CP1, and be spaced apart from an adjacent first conductive pattern CP1 by a certain distance. At this time, only the second conductive patterns CP2 may be disposed on the second base substrate BS2 as shown in FIGS. 10B, 10C and 10D. As shown in FIGS. 10C and 10D, when the first base substrate BS1 and the second base substrate BS2 are combined together using the adhesive layer ADL, the first adhesive pattern ADP1 and the second conductive patterns CP2 may partially overlap with each other at intersection portions of the first adhesive pattern ADP1 and the second conductive patterns CP2, and the first adhesive pattern ADP1 and the first conductive patterns CP1 may not overlap with each other. In addition, the pressure sensitive material layer PSL and the adhesive layer ADL may not overlap with each other in the sensing region SA of the first and second base substrates BS1 and BS2. The pressure sensitive material layer PSL may be provided between the first and second conductive patterns CP1 and CP2 in the sensing regions SA of the first and second base substrate BS1 and BS2. The pressure sensitive material layer PSL may fill in a space between the first and second conductive patterns CP1 and CP2 to remove an air gap that may exist in the space.

Figure 13:
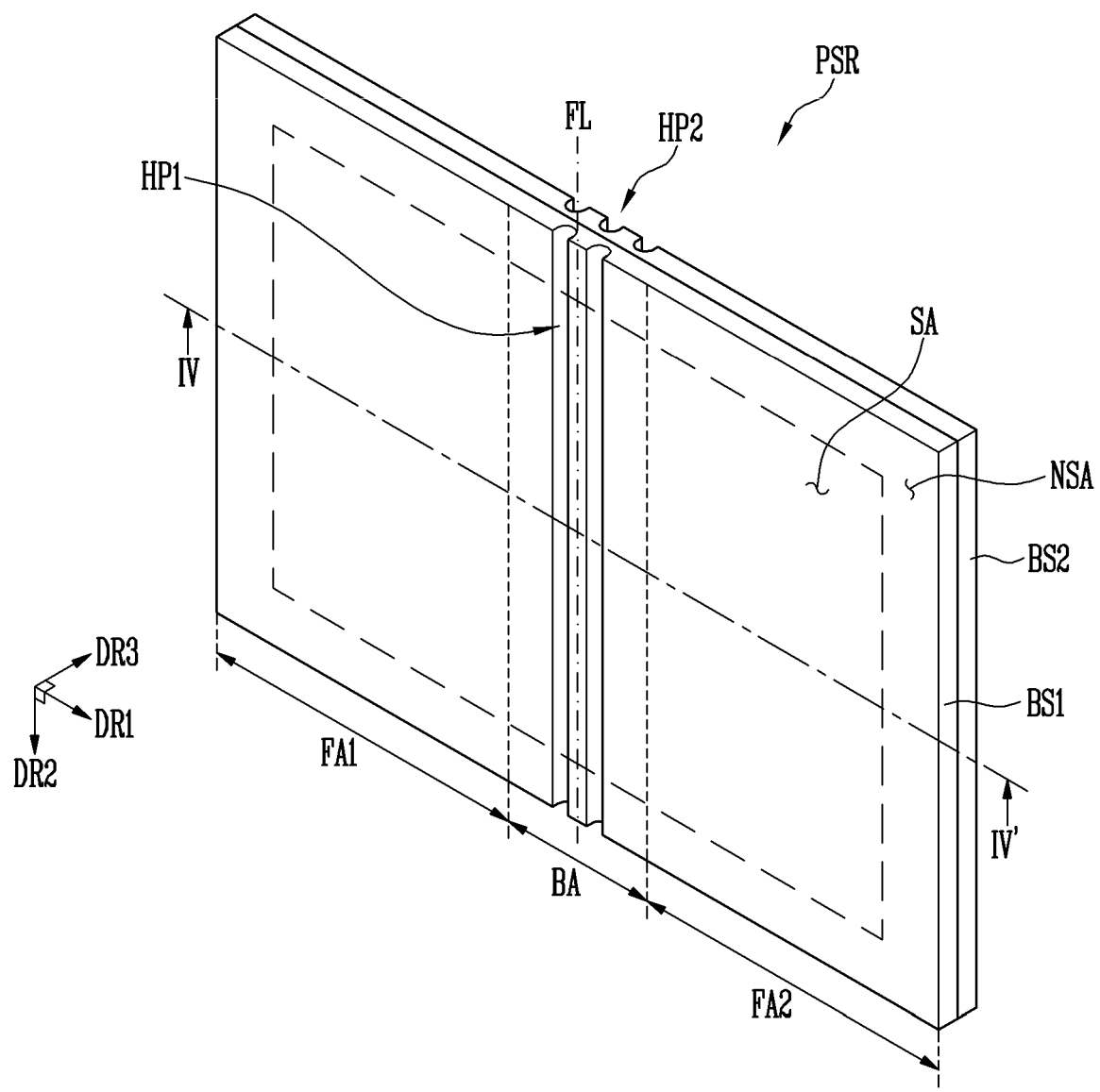
FIG. 13 is a perspective view of a pressure sensor constructed according to another exemplary embodiment of the invention.
Figure 14:
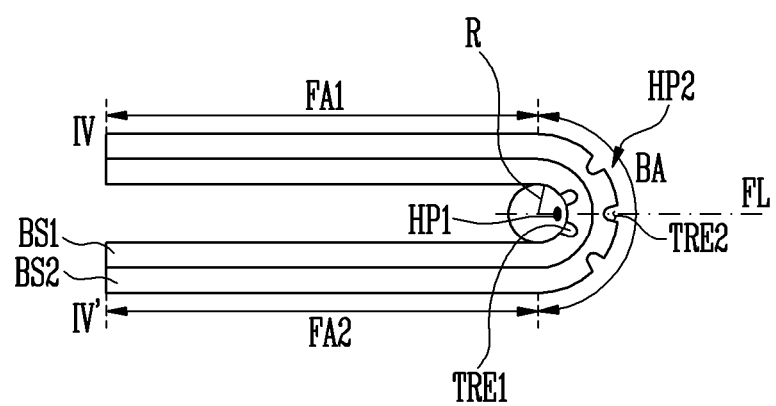
FIG. 14 is a cross-sectional view of the pressure sensor of FIG. 13 when the pressure sensor is folded.
Figure 15:
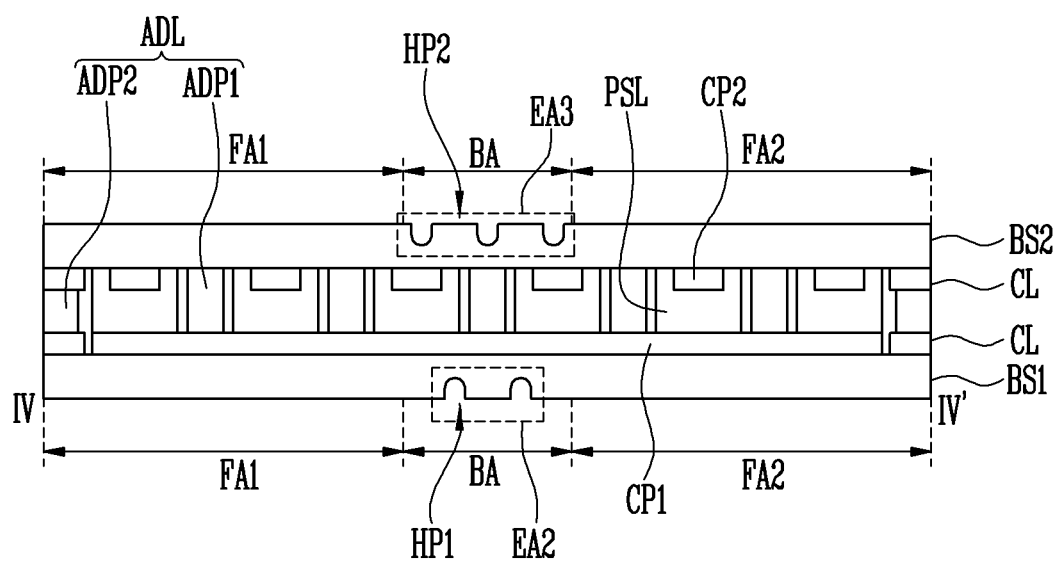
FIG. 15 is a cross-sectional view taken along line IV-IV' of FIG. 13.
Figure 16A:
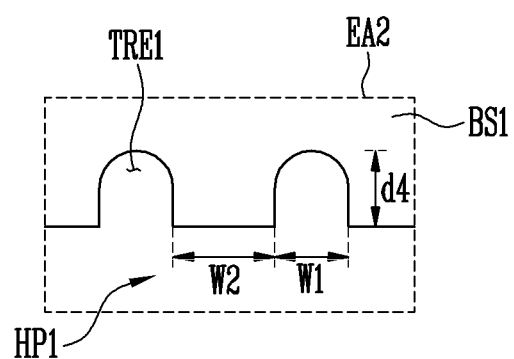
FIG. 16A is an enlarged view of region EA2 of FIG. 15.
Figure 16B:
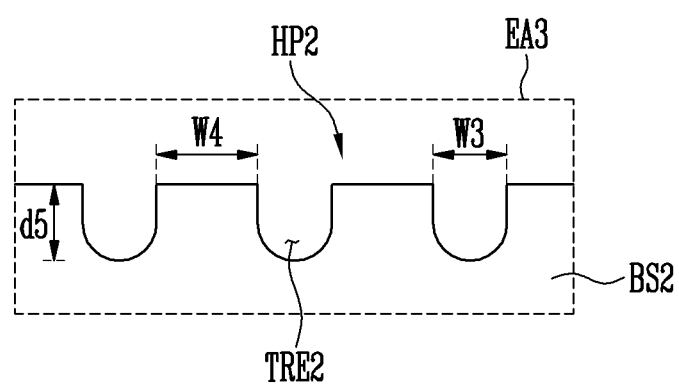
FIG. 16B is an enlarged view of region EA3 of FIG. 15.

FIG. 13 is a perspective view of a pressure sensor constructed according to another exemplary embodiment of the invention. FIG. 14 is a cross-sectional view of the pressure sensor of FIG. 13 when the pressure sensor is folded. FIG. 15 is a cross-sectional view taken along line IV-IV of FIG. 13. FIG. 16A is an enlarged view of region EA2 of FIG. 15, and FIG. 16B is an enlarged view of region EA3 of FIG. 15. In another exemplary embodiment, only differences from the above-described embodiment will be mainly described to avoid redundancy. In this embodiment, portions not particularly described in this embodiment follow those of the above-described embodiment. In addition, identical reference numerals refer to identical components, and similar reference numerals refer to similar components.

Referring to FIGS. 13 to 15, 16A, and 16B, the pressure sensor PSR according to the illustrated embodiments may include a first base substrate BS1, a plurality of first conductive patterns CP1, a pressure sensitive material layer PSL, a second substrate BS2, a plurality of second conductive patterns CP2, and an adhesive layer ADL.

At least a portion of the pressure sensor PSR may have flexibility, and the pressure sensor PSR may be folded at the portion having flexibility. The pressure sensor PSR may include a bent region BA that has flexibility and is bendable, and first and second flat regions FA1 and FA2 provided at at least one side of the bent region BA and are not folded. The first and second flat regions FA1 and FA2 may have flexibility.

When a center line about which the pressure sensor PSR is folded is a folding line FL, the folding line FL may be provided in plurality, and be provided in the bent region BA.

The first base substrate BS1 may be made of a material having flexibility to be foldable. The first base substrate BS1 may include a sensing region SA and a non-sensing region NSA. The first conductive patterns CP1 may be arranged in the sensing region SA of the first base substrate BS1. The first conductive patterns CP1 may be connected to the sensing unit (see DSR of FIG. 5) through connection lines CL arranged in the non-sensing region NSA of the first base substrate BS1.

The second base substrate BS2 may also be made of a material having flexibility to be foldable. The second base substrate BS2 may include a sensing region SA corresponding to the sensing region SA of the first base substrate BS1 and a non-sensing region NSA corresponding to the non-sensing region NSA of the first base substrate BS1. The second conductive patterns CP2 may be arranged in the sensing region SA of the second base substrate BS2. The second conductive patterns CP2 may be connected to the driving unit (see DVR of FIG. 5) through connection lines CL arranged in the non-sensing region NSA of the second base substrate BS2.

The pressure sensitive material layer PSL and the adhesive layer may be disposed between the first base substrate BS1 and the second base substrate BS2.

The pressure sensitive material layer PSL is a component having an electrical characteristic that is changed depending on the degree of deformation thereof, and the resistance of the pressure sensitive material layer PSL may be changed depending on external pressure applied between the first conductive patterns CP1 and the second conductive patterns CP2. That is, the resistance of the pressure sensitive material layer PSL may be changed depending on external pressure applied to the pressure sensor PSR. For example, the resistance of the pressure sensitive material layer PSL may decrease as the pressure increases.

The pressure sensitive material layer PSL may be disposed between the first and second conductive patterns CP1 and CP2 and fill in a space between the first and second conductive patterns CP1 and CP2 to remove an air gap that may exist in the space. The air gap may maintain the first and second conductive patterns CP1 and CP2 to be spaced apart from each other at a certain distance and serve as a factor that blocks the space between the first and second conductive patterns CP1 and CP2 from being narrowed. If the air gap is removed as the pressure sensitive material layer PSL deformed by a pressure applied thereto is provided between the first and second conductive patterns CP1 and CP2, the distance between the first and second conductive patterns CP1 and CP2 can be easily reduced. Thus, if external pressure is applied to the pressure sensor PSR, the distance between the first and second conductive patterns CP1 and CP2 is reduced by the applied pressure, so that a current can flow between the first and second conductive patterns CP1 and CP2. The pressure sensor PSR can sense a touch pressure of a user and a position of the touch pressure, using the current flowing between the first and second conductive patterns CP1 and CP2.

The first base substrate BS1 may include the bent region BA and the first and second flat regions FA1 and FA2. The first base substrate BS1 may be folded such that the first flat region FA1 and the second flat region FA2 face each other about the folding line FL.

The second base substrate BS2 may also include the bent region BA and the first and second flat regions FA1 and FA2.

When the pressure sensor PSR is folded along the folding line FL, there may occur a bending breakage where the first and second base substrates BS1 and BS2 are broken by a stress applied to the pressure sensor PSR. In order to reduce the bending breakage, it is advantageous to improve shock resistance characteristics of the first and second base substrates BS1 and BS2.

To this end, the pressure sensor PSR according to the exemplary embodiment may include a first flexibility enhancing part HP1 and a second flexibility enhancing part HP2. The first and second flexibility enhancing parts are described herein as being formed as first and second groove parts, as an example, but any shape, configuration or material that enhances flexibility may be used.

The first groove part HP1 may be provided in the bent region BA of the first base substrate BS1. Specifically, the first groove part HP1 may be disposed on a surface corresponding to the bent region BA of the first base substrate BS1, in which the first conductive patterns CP1 and the pressure sensitive material layer PSL are not provided. For example, the first groove part HP1 may be disposed on a back surface of the first base substrate BS1.

In an exemplary embodiment, the first groove part HP1 may include one or more discontinuities that aid flexibility such as trenches TRE1. The first trenches TRE1 may be regularly or irregularly disposed on the back surface of the first base substrate BS1. However, the first trenches TRE1 may be preferably regularly disposed on the back surface of the base substrate BS1 from the viewpoint of the easiness of manufacturing of the first base substrate BS1.

Each first trench TRE1 may have a semi-elliptical shape including a Gaussian shape as shown in the drawings, but the inventive concepts are not limited thereto. For example, each first trench TRE1 may have various shapes including a semicircular shape, a conical shape, a trapezoidal shape, a circular shape, a polygonal shape, a quadrangular shape, and the like. The width w1 of each first trench TRE1 may be about 20 μm to about 30 μm, but the inventive concepts are not limited thereto. In addition, the distance w2 between adjacent first trenches TRE1 may be about 100 μm to about 200 μm, but the inventive concepts are not limited thereto.

Each first trench TRE1 may be dug deep toward a top surface of the first base substrate BS1, on which the first conductive patterns CP1 are located, from the back surface of the first base substrate BS1. Each first trench TRE1 may be dug deep toward the top surface from the back surface of the first base substrate BS1 to have a depth d4 that is equal to or smaller than a half of the thickness of the first base substrate BS1 by considering the reliability of the first base substrate BS1.

The back surface of the first base substrate BS1 may include a surface having unevenness due to the first groove part HP1 including the first trenches TRE1.

The second groove part HP2 may be provided in the bent region BA of the second base substrate BS2. Specifically, the second groove part HP2 may be disposed on a surface of the bent region BA of the second base substrate BS2, on which the second conductive patterns CP2 are not provided. For example, the second groove part HP2 may be disposed on a top surface of the second base substrate BS2.

In an exemplary embodiment, the second groove part HP2 may include one or more discontinuities that aid flexibility such as second trenches TRE2. The second trenches TRE2 may be regularly or irregularly disposed on the top surface of the second base substrate BS2. The second trenches TRE2 may be regularly disposed on the top surface of the second base substrate BS2 from the viewpoint of the easiness of manufacturing of the second base substrate BS2.

Each second trench TRE2 may have a semi-elliptical shape as shown in the drawings, but the inventive concepts are not limited thereto. For example, each second trench TRE2 may have various shapes including a semicircular shape, a conical shape, a trapezoidal shape, a circular shape, a polygonal shape, a quadrangular shape, and the like. The width w3 of each second trench TRE2 may be about 20 μm to about 30 μm, but the inventive concepts are not limited thereto. In addition, the distance w4 between adjacent second trenches TRE2 may be about 100 μm to about 200 μm, but the inventive concepts are not limited thereto.

Each second trench TRE2 may be dug deep toward a back surface of the second base substrate BS2, on which the second conductive patterns CP2 are located, from the top surface of the second base substrate BS2. At this time, each second trench TRE2 may be dug deep toward the back surface from the top surface of the second base substrate BS2 to have a depth d5 that is equal to or smaller than a half of the thickness of the second base substrate BS2 by considering the reliability of the second base substrate BS2.

The top surface of the second base substrate BS2 may include a surface having unevenness due to the second groove part HP2 including the second trenches TRE2.

Each first trench TRE1 and each second trench TRE2 may be disposed on corresponding base substrates, using laser, etc., and be disposed to cross each other when viewed in the vertical direction. That is, each first trench TRE1 and each second trench TRE2 may be alternately disposed when viewed in the vertical direction. However, the inventive concepts are not limited thereto, and each first trench TRE1 and each second trench TRE2 may be disposed to correspond to each other in the vertical direction.

When the pressure sensor PSR is folded along the folding line FL, the bent region BA may be a circular shape having a predetermined radius R to be foldable with a predetermined curvature radius as shown in FIG. 14.

In an exemplary embodiment, the width w1 of each first trench TRE1 may be determined according to the curvature of the bent region BA of the first base substrate BS1, and the width w2 of the second trench TRE2 may be determined according to the curvature of the bent region BA of the second base substrate BS2. For example, when the curvature of the bent region BA of the first base substrate BS1 is nR (n is a natural number of 1 or more), the width w1 of each first trench TRE1 may be about 2 πn. In addition, when the curvature of the bent region BA of the second base substrate BS2 is nR (n is a natural number of 1 or more), the width w3 of each second trench TRE2 may be about 2 πn.

When the pressure sensor PSR is folded along the folding line FL, stresses applied to the first and second base substrates BS1 and BS2 are not concentrated in the folded direction but may be dispersed through the first and second groove parts HP1 and HP2. Accordingly, it is possible to reduce a phenomenon that the pressure sensor PSR is broken by fatigue due to the stresses applied to the pressure sensor PSR when the pressure sensor PSR is folded. As a result, the durability of the pressure sensor PSR can be improved.

According to the exemplary embodiments, when a pressure caused by a touch of a user is sensed, the pressure sensor PSR senses an intensity of the touch pressure and a touch position of the user, so that the reliability of the pressure sensor PSR can be improved.

Figure 17:
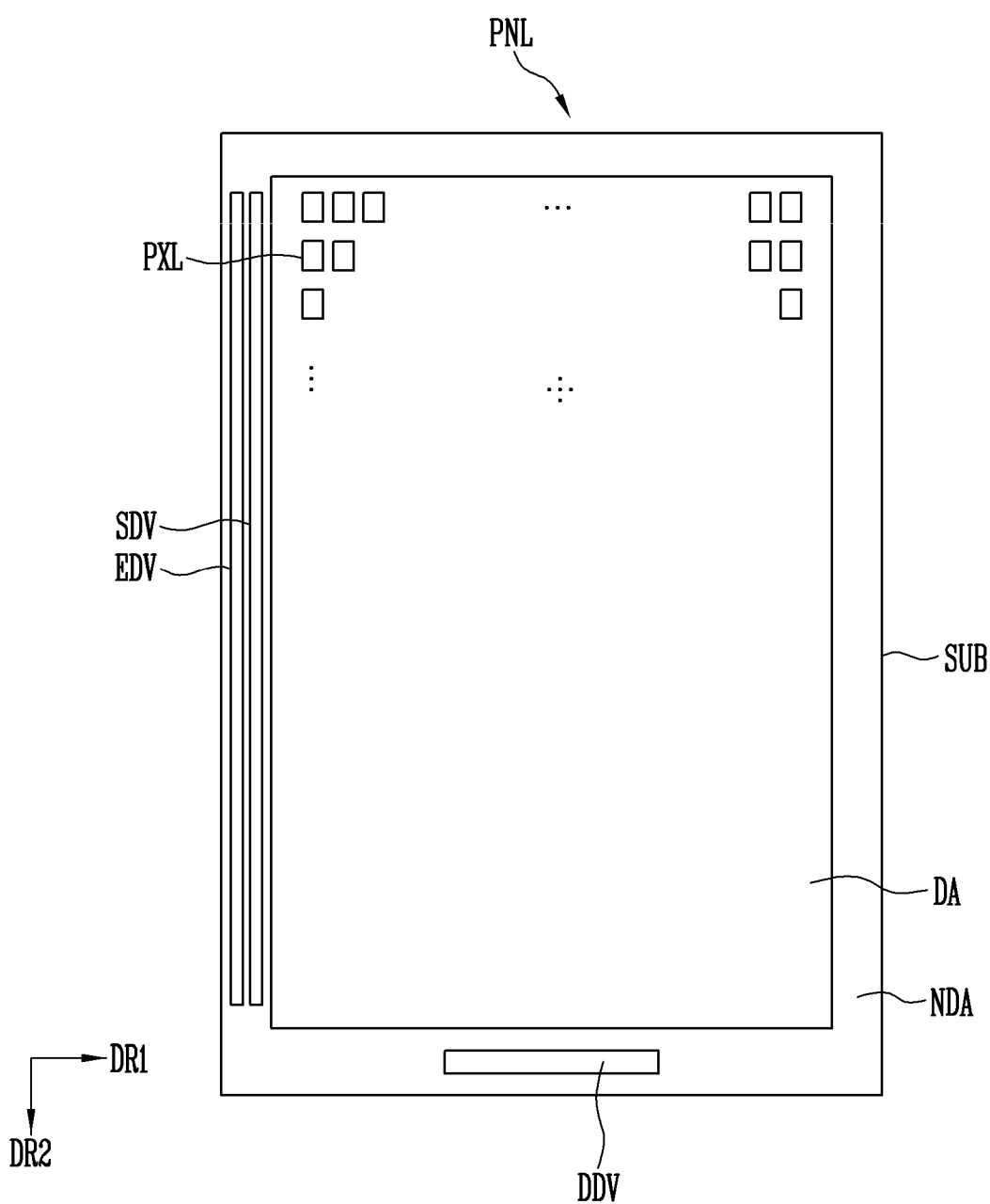
FIG. 17 is a plan view of a display panel of the display device of FIG. 1.

FIG. 17 is a plan view of the display panel of the display device of FIG. 1.

Referring to FIGS. 1 and 17, the display panel PNL according to the exemplary embodiment may display an image. In an exemplary embodiment, the display panel PNL may be an organic light emitting display panel (OLED panel).

The display panel PNL may include a substrate SUB, pixels PXL, a driving unit, a power supply unit, a line unit, and the like.

The substrate SUB may include a display region DA and a non-display region NDA. The display region DA is a region in which the pixels PXL for displaying the image are provided, and may correspond to the sensing region SA of the pressure sensor PSR. The non-display region NDA is a region in which the pixels PXL are not provided, and the image is not displayed in the non-display region NDA. The non-display region NDA may be provided with the driving unit for driving the pixels PXL, the power supply unit for applying a power source to the pixels PXL, and some of lines for connecting the pixels PXL and the driving unit. The non-display region NDA may correspond to the non-sensing region NSA of the pressure sensor PSR.

Each pixel PXL is a minimum unit for displaying an image, and the pixel PXL may be provided in plural numbers in the display region DA. In an exemplary embodiment, the pixel PXL may include an organic light emitting device. The pixel PXL may emit light of one color among red, green, blue, and white, but the inventive concepts are not limited thereto. For example, the pixel PXL may emit light of one color among cyan, magenta, yellow, and the like.

The driving unit provides a signal to each pixel PXL through the line unit, and accordingly, can control driving of each pixel PXL.

The driving unit may include a scan driver SDV for providing a scan signal to each pixel PXL through a scan line, an emission driver EDV for providing an emission control signal to each pixel PXL through an emission control line, a data driver DDV for providing a data signal to each pixel PXL through a data line, and a timing controller. The timing controller may control the scan driver SDV, the emission driver EDV, and the data driver DDV.

The power supply unit may include at least one power line. For example, the power supply unit may include a first power supply line and a second power supply line (not shown). The power supply unit may supply power to each of the pixels PXL arranged in the display region DA.

Figure 18:
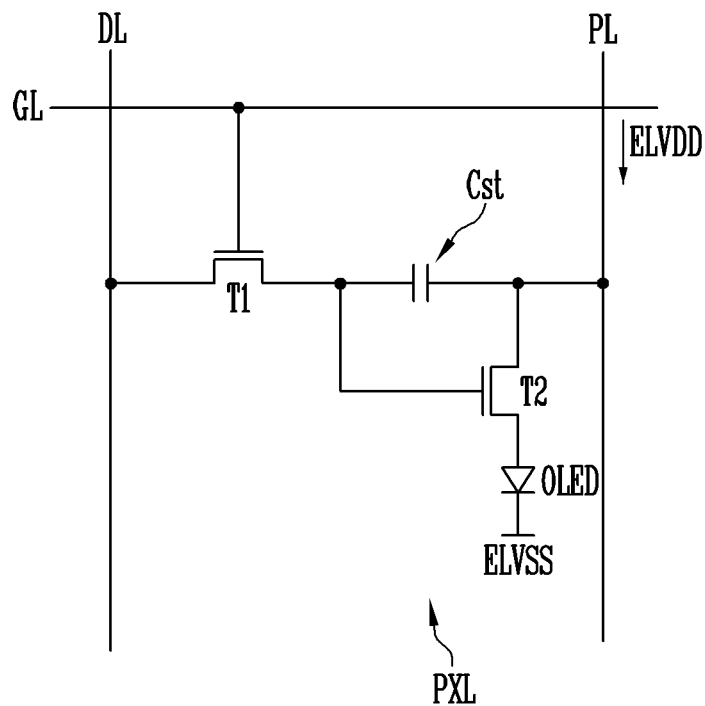
FIG. 18 is an equivalent circuit diagram of one of the pixels shown in FIG. 17.

FIG. 18 is an equivalent circuit diagram of one of the pixels shown in FIG. 17. For convenience of description and to avoid redundancy, a pixel and lines connected to the pixel are mainly illustrated.

Referring to FIGS. 17 and 18, each pixel PXL may include a transistor connected to lines, a light emitting element OLED connected to the transistor, and a capacitor Cst. The light emitting element OLED may be a top-emission organic light emitting element or a bottom-emission organic light emitting element. The organic light emitting element OLED may be an organic light emitting diode.

Each pixel PXL is a pixel driving circuit for driving the light emitting element OLED, and may include a first transistor (or switching transistor) T1, a second transistor (or driving transistor) T2, and the capacitor Cst. A first power source ELVDD may be provided to the second transistor T2 through a power line PL, and a second power source ELVSS may be provided to the light emitting element OLED. The second power source ELVSS may be set to a voltage lower than that of the first power source ELVDD.

The first transistor T1 outputs a data signal applied to a data line DL in response to a scan signal applied to a gate line GL. The capacitor Cst charges a voltage corresponding to the data signal received from the first transistor T1. The second transistor T2 is connected to the light emitting element OLED. The second transistor T2 controls a driving current flowing through the light emitting element OLED, corresponding to a quantity of charges stored in the capacitor Cst.

In an exemplary embodiment, it is illustrated that one pixel PXL includes two transistors T1 and T2. However, the inventive concepts are not limited thereto, and one pixel PXL may include one transistor and one capacitor, or include three or more transistors and two or more capacitors. For example, one pixel PXL may include seven transistors, the light emitting element OLED, and the capacitor Cst.

Figure 19:
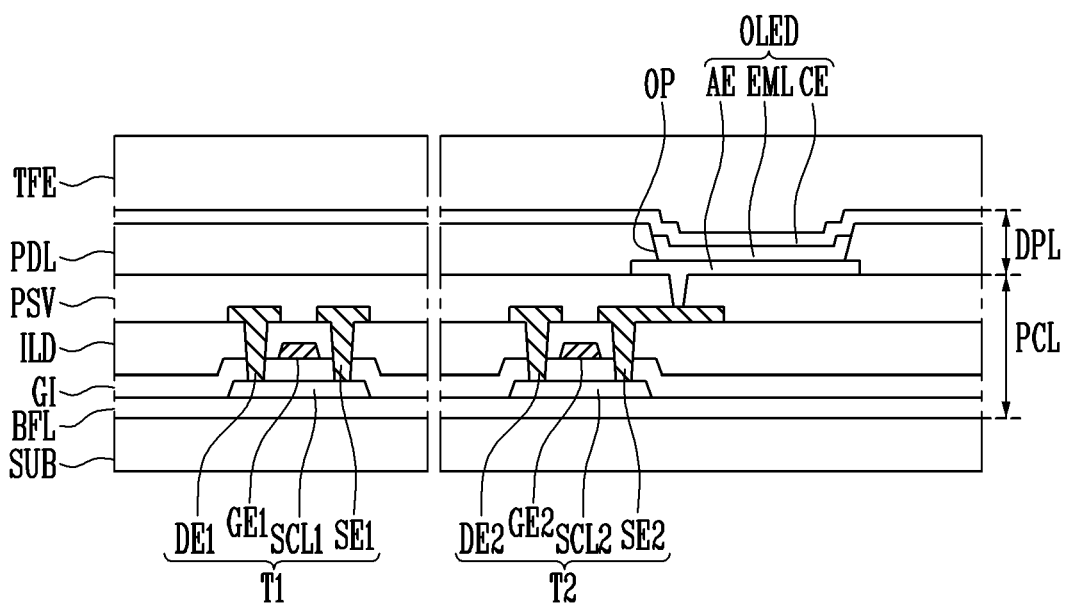
FIG. 19 is a cross-sectional view of a portion of the display panel of FIG. 17.

FIG. 19 is a cross-sectional view of a portion of the display panel of FIG. 17.

Referring to FIGS. 17 and 19, the display panel PNL according to the illustrated embodiment may include a substrate SUB, a pixel circuit unit PCL, a display element layer DPL, and a thin film encapsulation layer TFE.

The substrate SUB may be made of a material having flexibility to be bendable or foldable, and have a single- or multi-layered structure.

The pixel circuit unit PCL may include a buffer layer BFL disposed on the substrate SUB and first and second transistors T1 and T2 disposed on the buffer layer BFL.

The buffer layer BFL may prevent an impurity from being diffused into the first and second transistors T1 and T2. The buffer layer BFL may be provided in a single layer, but be provided in a multi-layer including at least two layers. When the buffer layer BFL is provided in the multi-layer, the layers may be formed of the same material or be formed of different materials. The buffer layer BFL may be omitted according to the material and process conditions of the substrate SUB.

The first transistor T1 may be a switching transistor for switching the second transistor T2. The second transistor T2 may be a driving transistor electrically connected to a light emitting element OLED of the display element layer DPL to drive the light emitting element OLED.

The first transistor T1 may include a first semiconductor layer SCL1, a first gate electrode GE1, a first source electrode SE1, and a first drain electrode DE1. The second transistor T2 may include a second semiconductor layer SCL2, a second gate electrode GE2, a second source electrode SE2, and a second drain electrode DE2.

The first and second semiconductor layers SCL1 and SCL2 may be disposed on the buffer layer BFL. The first and second semiconductor layers SCL1 and SCL2 may include source regions and drain regions, which are in contact with the first and second source electrodes SE1 and SE2 and the first and second drain electrodes DE1 and DE2, respectively. A region between the source region and the drain region may be a channel region. Each of the first and second semiconductor layers SCL1 and SCL2 may be a semiconductor pattern made of poly-silicon, amorphous silicon, oxide semiconductor, etc. The channel region is a semiconductor pattern undoped with an impurity, and may be an intrinsic semiconductor. The source region and the drain region are semiconductor patterns dope with the impurity. The impurity may include impurities such as an n-type impurity, a p-type impurity, and other metals.

The first gate electrode GE1 may be disposed on the first semiconductor layer SCL1 with a gate insulating layer GI interposed therebetween. The second gate electrode GE2 may be disposed on the second semiconductor layer SCL2 with the gate insulating layer GI interposed therebetween.

The first source electrode SE1 and the first drain electrode DE1 may be in contact with the source region and the drain region of the first semiconductor layer SCL1 through contact holes passing through an interlayer insulating layer ILD and the gate insulating layer GI, respectively. The second source electrode SE2 and the second drain electrode DE2 may be in contact with the source region and the drain region of the second semiconductor layer SCL2 through contact holes passing through the interlayer insulating layer ILD and the gate insulating layer GI, respectively.

A protective layer PSV may be provided over the first and second transistor T1 and T2.

The display element layer DPL may include the light emitting element OLED disposed on the protective layer PSV. The light emitting element OLED may include a first electrode AE, a second electrode CE, and an emitting layer EML disposed between the two electrodes AE and CE. Here, any one of the first and second electrodes AE and CE may be an anode electrode, and the other of the first and second electrodes AE and CE may be a cathode electrode. For example, the first electrode AE may be an anode electrode and the second electrode CE may be a cathode electrode. When the light emitting element OLED is a top-emission type organic light emitting element, the first electrode AE may be a reflective electrode, and the second electrode CE may be a transmissive electrode. In an exemplary embodiment, a case where the light emitting element OLED is a top-emission type organic light emitting element, and the first electrode AE is an anode electrode is described as an example.

The first electrode AE may be connected to the second source electrode SE2 of the second transistor T2 through a contact hole passing through the protective layer PSV. The first electrode AE may include a reflective layer capable of reflecting light and a transparent conductive layer disposed on the top or bottom of the reflective layer. At least one of the transparent conductive layer and the reflective layer may be connected to the second source electrode SE2.

The display element layer DPL may further include a pixel defining layer PDL having an opening that allows a portion of the first electrode AE, e.g., a top surface of the first electrode AE to be exposed therethrough.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be disposed on the exposed surface of the first electrode AE.

The emitting layer EML may include a low-molecular or high-molecular material. In an exemplary embodiment, the low-molecular material may include copper phthalocyanine (CuPc), N,N'-Di(naphthalene-1-yl)-N,N'-diphenyl-benzidine (NPB), tris-8-hydroxyquinoline aluminum (Alq3), and the like. The high-molecular material may include poly(3, 4-ethylenedioxythiophene) (PEDOT)-, poly(phenylene-vinylene) (PPV)-, poly(fluorine)-based materials.

The emitting layer EML may be provided as a single layer, or as a multi-layer including various functions. When the emitting layer EML is provided as a multi-layer, the emitting layer EML may have a structure in which a hole injection layer, a hole transport layer, an emission layer, an electron transport layer, an electron injection layer, and the like are stacked in a single or complex structure. The inventive concepts are not necessarily limited thereto, and the emitting layer EML may have various structures. In addition, at least a portion of the emitting layer EML may be integrally formed throughout a plurality of first electrodes AE, or be individually provided to correspond to each of the plurality of first electrodes AE. The color of light generated in the emitting layer EML may be one of red, green, blue, and white, but the inventive concepts are not limited thereto. For example, the color of light generated in a light generation layer of the emitting layer EML may be one of magenta, cyan, and yellow.

The second electrode CE may be disposed on the emitting layer EML. The second electrode CE may be a semi-transmissive reflective layer. For example, the second electrode CE may be a thin metal layer having a thickness, through which light emitted through the emitting layer EML can be transmitted. The second electrode CE may transmit a portion of the light emitted from the emitting layer EML therethrough, and may reflect the rest of the light emitted from the emitting layer EML.

The thin film encapsulation layer TFE may be provided over the light emitting element OLED.

The thin film encapsulation layer TFE may be provided in a single layer, or in a multi-layer. The thin film encapsulation layer TFE may include a plurality of insulating layers that cover the light emitting element OLED. Specifically, the thin film encapsulation layer TFE may include a plurality of inorganic layers and a plurality of organic layers. For example, the thin film encapsulation layer TFE may have a structure in which the inorganic layers and the organic layers are alternately stacked. Also, in some cases, the thin film encapsulation layer TFE may be an encapsulating substrate that is disposed over the light emitting element OLED and is joined together with the substrate SUB through a sealant.

Figure 20:
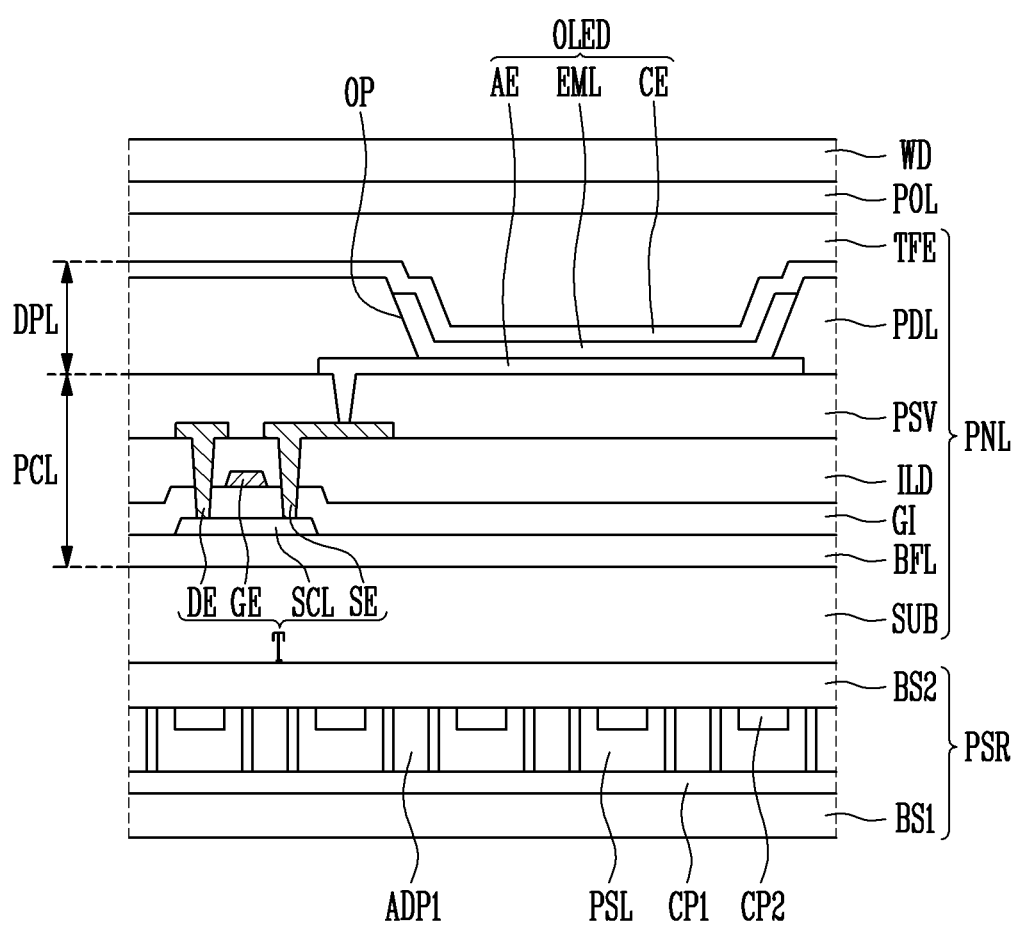
FIG. 20 is a cross-sectional view of an exemplary embodiment of the display device having the pressure sensor shown in FIG. 4.

FIG. 20 is a cross-sectional view of an exemplary embodiment of the display device having the pressure sensor shown in FIG. 4.

Referring to FIGS. 1 to 4 and 20, the display device DD according to the illustrated embodiments may include a pressure sensor, a display panel PNL, and a window WD.

The display panel PNL may include a substrate SUB, a pixel circuit unit PCL disposed on the substrate SUB, a display element layer DPL connected to the pixel circuit unit PCL, and a thin film encapsulation layer TFE disposed on the display element layer DPL.

The pixel circuit unit PCL may include at least one transistor T and a protective layer PSV covering the transistor T. The transistor T may include a semiconductor layer SCL, a gate electrode GE, a source electrode SE, and a drain electrode DE. The semiconductor layer SCL may include a source region and a drain region, which are doped or injected with an impurity and a channel region provided between the two regions.

The display element layer DPL may include a light emitting element OLED disposed on the pixel circuit unit PCL. The light emitting element OLED may include a first electrode AE, a second electrode CE, and an emitting layer EML disposed between the two electrodes AE and CE.

The thin film encapsulation layer TFE may be provided over the light emitting element OLED to isolate the light emitting element OLED from an external environment. For example, the thin film encapsulation layer TFE may prevent external moisture and oxygen from penetrating into the light emitting element OLED.

The window WD may have a shape corresponding to the display panel PNL. Also, the window WD may have a plate shape having both surfaces. The window WD may include a material that enables light to be transmitted therethrough. For example, the window WD may be made of a transparent polymer resin or the like, having flexibility. The window WD may prevent the display panel PNL from being damaged by an external shock.

A polarizing film POL may be disposed between the display panel PNL and the window WD. The polarizing film POL may prevent external light from being reflected from the display panel PNL. For example, the polarizing film POL may include a linear polarizer and a retardation layer disposed on the linear polarizer.

In an exemplary embodiment, the pressure sensor PSR may be disposed on one of the surfaces of the display panel PNL, e.g., a surface opposite to that of the light emitting direction. The pressure sensor PSR may include a first base substrate BS1, a plurality of first conductive patterns CP1, a second base substrate BS2, and a plurality of second conductive patterns CP2.

Each of the first and second base substrates BS1 and BS2 may be made of a material having flexibility to be bendable or foldable, and have a single- or multi-layered structure.

The first conductive patterns CP1 may be provided in the sensing region SA of the first base substrate BS1. The second conductive patterns CP2 may be disposed on one surface of the base substrate BS2, e.g., a surface facing the first conductive patterns CP1. Also, the second conductive patterns CP2 may be provided in the sensing region SA of the second base substrate BS2.

The pressure sensor PSR may further include a pressure sensitive material layer PSL and an adhesive layer ADL, which are disposed between the first and second base substrates BS1 and BS2.

The resistance of the pressure sensitive material layer PSL may be changed depending on a pressure applied to the pressure sensor PSR. For example, the resistance of the pressure sensitive material layer PSL may decrease as the pressure increases.

The pressure sensitive material layer PSL may be disposed between the first and second conductive patterns CP1 and CP2 to fill in a space between the first and second conductive patterns CP1 and CP2. That is, the pressure sensitive material layer PSL may fill in a space between the first and second conductive patterns CP1 and CP2 to remove an air gap that may exist in the space.

The adhesive layer ADL may include a first adhesive pattern ADP1 and a second adhesive pattern ADP2. The first adhesive pattern ADP1 may be provided in the sensing region SA, and the second adhesive pattern ADP2 may be provided in the non-sensing region NSA. The first and second adhesive patterns ADP1 and ADP2 may additionally remove an air gap remaining in a space between the first and second base substrates BS1 and BS2.

If a pressure is applied to the pressure sensor PSR as a touch of a user occurs, the resistance of the pressure sensitive material layer PSL corresponding to the region to which the pressure is applied decreases. The display device DD according to the exemplary embodiments can sense a touch pressure of the user and simultaneously sense a touch position of the user by sensing a change in resistance.

Hereinafter, embodiments of the display device having the pressure sensor shown in FIGS. 13 to 15 will be described with reference to FIGS. 21 to 25.

Figure 21:
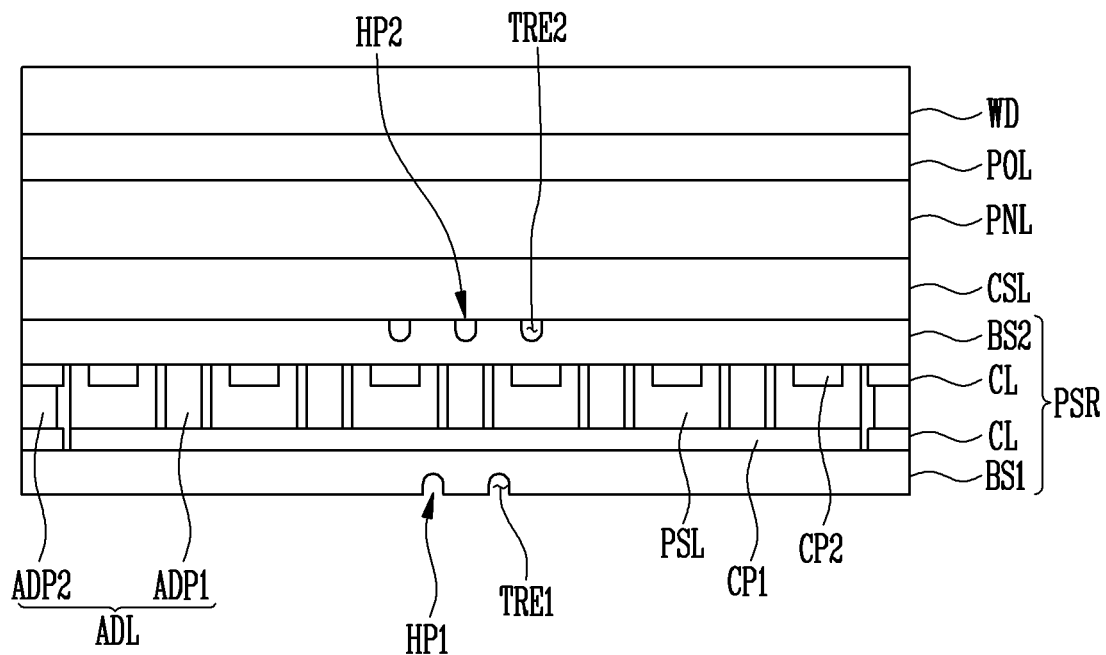
FIGS. 21 to 25 are cross-sectional views of display devices having the pressure sensor shown in FIGS. 13 to 15.
Figure 22:
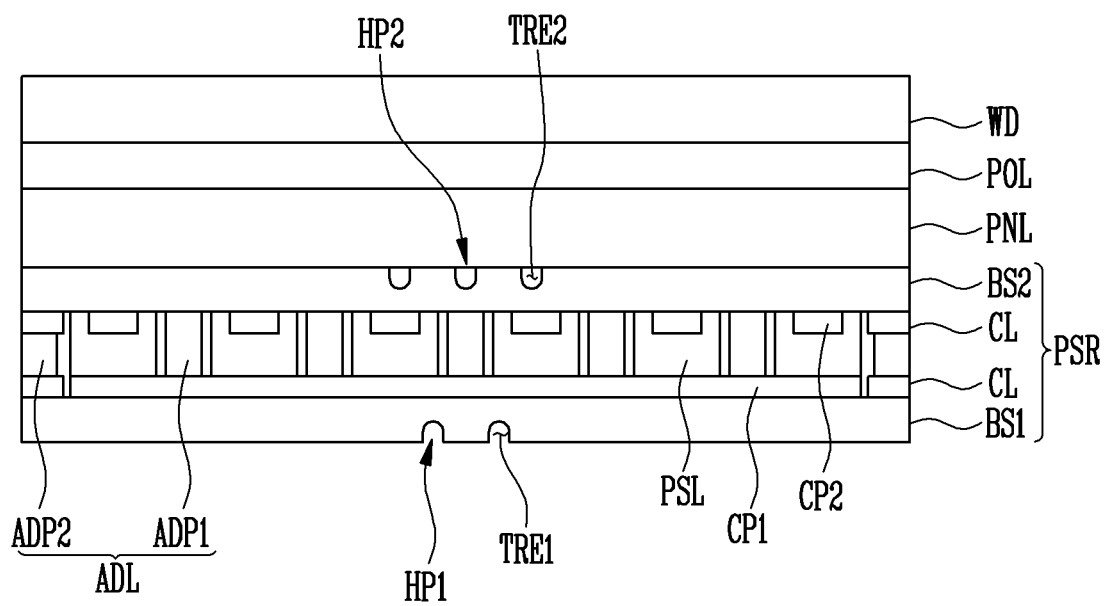

FIGS. 21 and 22 are cross-sectional views of a display device having the pressure sensor shown in FIGS. 13 to 15. In the display devices of FIGS. 21 and 22, portions different from those of the display device according to the above-described embodiment will be mainly described to avoid redundancy.

First, referring to FIGS. 13 to 15 and 21, the display device according to the exemplary embodiments may include a pressure sensor PSR, a display panel PNL, a polarizing film POL, and a window WD.

The display panel PNL includes a plurality of pixels (see PXL of FIG. 17), to provide a predetermined image to a user.

The display panel PNL may display an image on at least one surface thereof. In an exemplary embodiment, a case where an image is displayed on a top surface of the display panel PNL is illustrated for convenience of description. The top surface on which the image is displayed may be a flat surface having no curvature, or a curved surface having a predetermined curvature. Alternatively, the top surface on which the image is displayed may be provided in a shape that is temporarily flat but is bendable or rollable. In an exemplary embodiment, the top surface of the display panel PNL may mean a surface from which light is emitted.

The type of display panel PNL used to display the images is not particularly limited. For example, the display panel PNL may be an OLED panel.

The polarizing film POL may be disposed on the top surface of the display panel PNL. The polarizing film POL may prevent external light from being reflected from the display panel PNL.

The window WD may be disposed on the polarizing film POL. The window WD is disposed on the top surface of the display panel PNL, i.e., the surface on which an image is displayed, and is located at the upper outermost side of the display device, so that it is possible to protect the display device from external stress or shock.

The pressure sensor PSR may be disposed on a back surface of the display panel PNL. The pressure sensor PSR may include a first base substrate BS1, a plurality of first conductive patterns CP1, a pressure sensitive material layer PSL, a second base substrate BS2, a plurality of second conductive patterns CP2, and an adhesive layer ADL.

The first base substrate BS1 and the second base substrate BS2 may be made of a material having flexibility to be foldable. The first conductive patterns CP1 may be arranged in a sensing region SA of the first base substrate BS1, and the second conductive patterns CP2 may be arranged in a sensing region SA of the second base substrate BS2. The pressure sensitive material layer PSL is a component having an electrical characteristic that is changed depending on the degree of deformation thereof, and the resistance of the pressure sensitive material layer PSL may be changed depending on external pressure applied between the first conductive patterns CP1 and the second conductive patterns CP2. The adhesive layer ADL may be disposed between the first base substrate BS1 and the second base substrate BS2 to allow the first and second base substrates BS1 and BS2 to be adhered to each other.

The pressure sensor PSR may include a first flexibility enhancing part such as first groove part HP1 and a second flexibility enhancing part such as second groove part HP2, which are used to improve shock resistance characteristics.

The first groove part HP1 may be provided in a bent region BA of the first base substrate BS1, and the second groove part HP2 may be provided in a bent region BA of the second base substrate BA. In an exemplary embodiment, the first groove part HP1 may be provided on a back surface of the first base substrate BS1, and the second groove part HP2 may be provided on a top surface of the second base substrate BS2. The first groove part HP1 may include a plurality of discontinuities to aid flexibility, such as first trenches TRE1 having a shape that is dug deep toward a top surface of the first base substrate BS1 from the back surface of the first base substrate BS1. The second groove part HP2 may include a plurality of discontinuities to aid flexibility, such as second trenches TRE2 having a shape that is dug deep toward a back surface of the second base substrate BS2 from the top surface of the second base substrate BS2.

The display device may further include a cushion layer CSL disposed between the display panel PNL and the pressure sensor PSR. The cushion layer CSL may be disposed on the back surface of the display panel PNL, i.e., the surface on which any image is not displayed. In an exemplary embodiment, the back surface of the display panel PNL may mean a surface from which light is not emitted.

Therefore, the cushion layer CSL may be disposed on the surface of the display panel PNL, from which light is not emitted.

The cushion layer CSL may include a material that may be deformed by external shock or a touch pressure of a user. That is, the cushion layer CSL may include an elastically deformable material. The cushion layer CSL may include polyurethane or polyurethane foam. The display device including the cushion layer CSL can more effectively absorb external shock.

In an exemplary embodiment, since the cushion layer CSL is disposed on the pressure sensor PSR, the second groove part HP2 may be disposed between a back surface of the cushion layer CSL and the top surface of the second base substrate BS2.

In some embodiments, the cushion layer CSL may be omitted in the display device as shown in FIG. 22. In this case, the pressure sensor PSR disposed on the bottom of the display panel PNL may serve as the cushion layer CSL. As the pressure sensor PSR serves as the cushion layer CSL, the thickness of the display device can be reduced. Accordingly, it is possible to realize a thin thickness for the display device.

Figure 23:
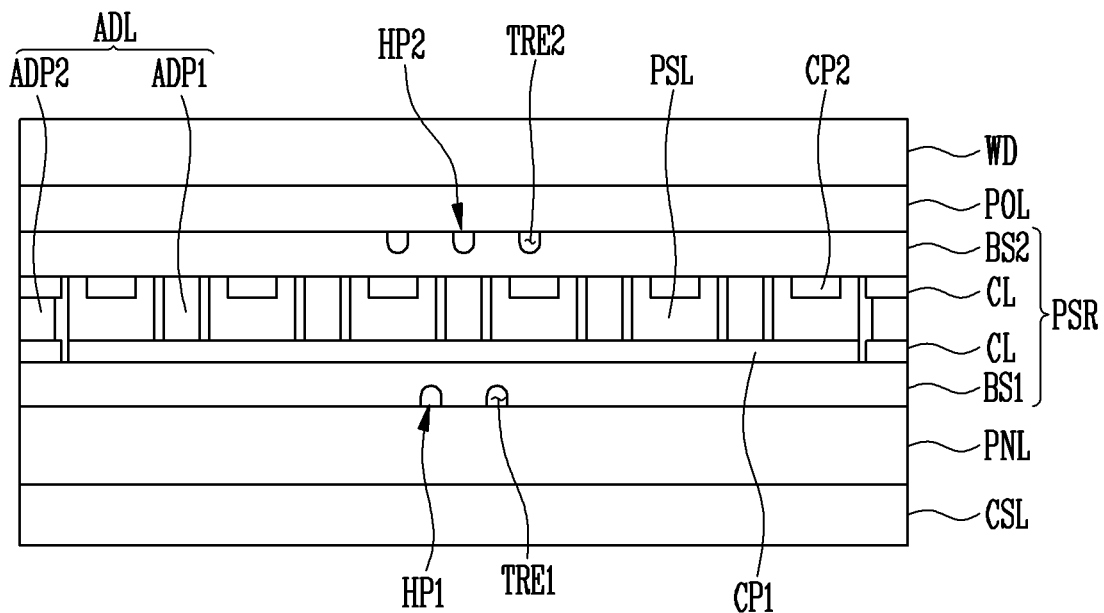
Figure 24:
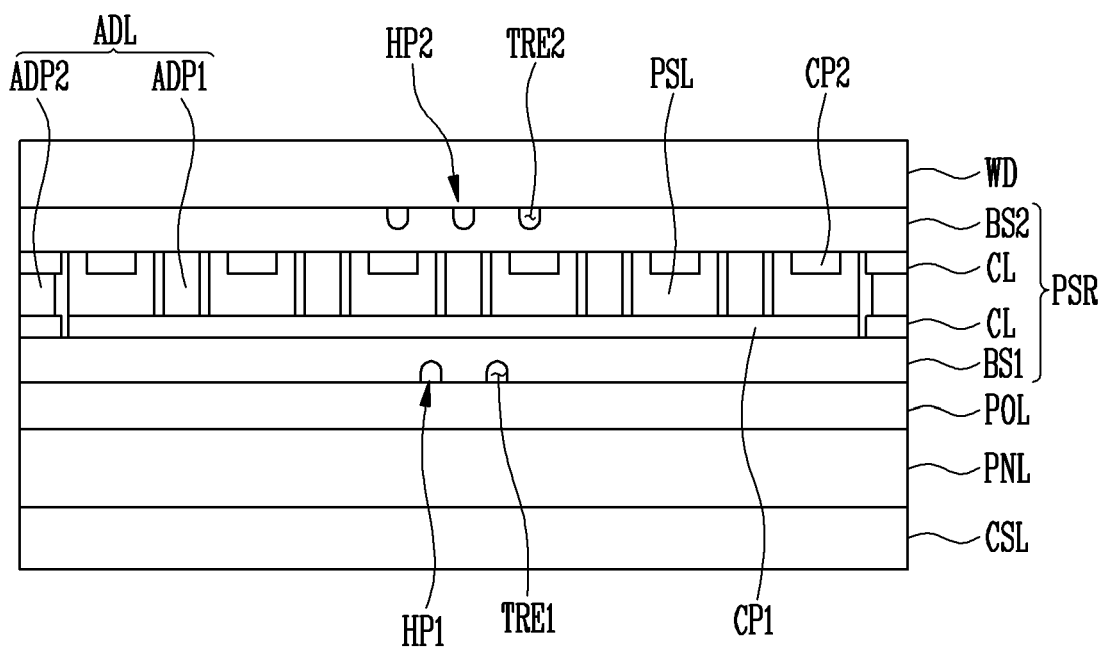

FIGS. 23 and 24 are sectional views illustrating an embodiment of the display device employing the pressure sensor shown in FIGS. 13 to 15. In the display devices of FIGS. 23 and 24, portions different from those of the display device according to the above-described embodiment will be mainly described to avoid redundancy.

Referring to FIGS. 13 to 15, 23, and 24, the display device according to the exemplary embodiments may include a cushion layer CSL, a display panel PNL, a pressure sensor PSR, a polarizing film POL, and a window WD.

The cushion layer CSL may be disposed on the bottom of the display panel PNL to protect the display panel PNL from external shock.

The display panel PNL may display an image on a top surface thereof. The display panel PNL may be disposed between the cushion layer CSL and the pressure sensor PSR.

The polarizing film POL may be disposed on the display panel PNL.

The window WD may be disposed on the polarizing film POL.

The pressure sensor PSR may include a first base substrate BS1, a plurality of first conductive patterns CP1, a pressure sensitive material layer PSL, a second base substrate BS2, a plurality of second conductive patterns CP2, and an adhesive layer ADL. The pressure sensor PSR may include a first groove part HP1 and a second groove part HP2, as discussed above.

The pressure sensor PSR, as shown in FIG. 23, may be disposed between the display panel PNL and the polarizing film POL. That is, the pressure sensor PSR may be disposed on the top surface of the display panel PNL. In this case, a top surface of the second base substrate BS2 may correspond to a back surface of the polarizing film POL, and a back surface of the first base substrate BS1 may correspond to the top surface of the display panel PNL, i.e., the surface on which an image is displayed and from which light is emitted.

The first groove part HP1 may correspond to a bent region BA of the first base substrate BS1, and be disposed between the top surface of the display panel PNL and the back surface of the first base substrate BS1. The first groove part HP1 may include a plurality of first trenches TRE1 having a shape that is dug deep toward a top surface of the first base substrate BS1 from the top surface of the display panel PNL, which corresponds to the back surface of the first base substrate BS1.

The second groove part HP2 may correspond to a bent region BA of the second base substrate BS2, and be disposed between the back surface of the polarizing film POL and the top surface of the second base substrate BS2. The second groove part HP2 may include a plurality of second trenches TRE2 having a shape that is dug deep toward a back surface of the second base substrate BS2 from the back surface of the polarizing film POL, which corresponds to the top surface of the second base substrate BS2.

In an exemplary embodiment, the first conductive patterns CP1 and the second conductive patterns CP2, which are included in the pressure sensor PSR, may be made of a transparent conductive material to have no influence on an image emitted from the display panel PNL. For example, the transparent conductive material may include silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nano tube, graphene, and the like.

In particular, when the first conductive patterns CP1 and the second conductive patterns CP2 are made of a transparent conductive material, the image emitted from the display panel PNL may be finally emitted from the window WD without light lost by the pressure sensor PSR.

In some embodiments, as shown in FIG. 24, the pressure sensor PSR may be disposed between the window WD and the polarizing film POL. In this case, the top surface of the second base substrate BS2 may correspond to a back surface of the window WD, and the back surface of the first base substrate BS1 may correspond to a top surface of the polarizing film POL. The second groove part HP2 corresponding to the bent region BA of the second base substrate BS2 may include the second trenches TRE2 having a shape that is dug deep toward the back surface of the second base substrate BS2 from the back surface of the window WD, which corresponds to the top surface of the second base substrate BS2. The first groove part HP1 corresponding to the bent region BA of the first base substrate BS1 may include the first trenches TRE1 having a shape that is dug deep toward the top surface of the first base substrate BS1 from the top surface of the polarizing film POL, which corresponds to the back surface of the first base substrate BS1.

Figure 25:
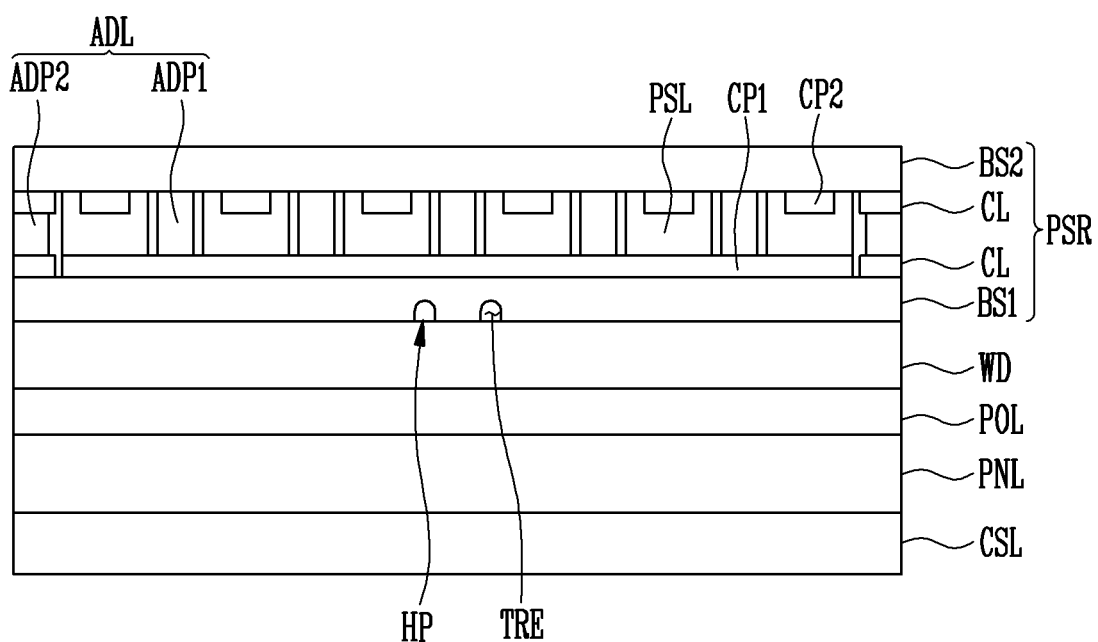

FIG. 25 is a sectional view illustrating an embodiment of the display device employing the pressure sensor shown in FIGS. 13 to 15. In the display devices of FIG. 25, portions different from those of the display device according to the above-described exemplary embodiments will be mainly described to avoid redundancy.

Referring to FIGS. 13 to 15 and 25, the display device according to the exemplary embodiments may include a cushion layer CSL, a display panel PNL, a polarizing film POL, a window WD, and a pressure sensor PSR.

The cushion layer CSL may be disposed on the bottom of the display panel PNL to protect the display panel PNL from external shock.

The display panel PNL may display an image on a top surface thereof. The display panel PNL may be provided on the cushion layer CSL.

The polarizing film POL may be disposed on the display panel PNL.

The window WD may be disposed on the polarizing film POL.

The pressure sensor PSR may be disposed on the window WD. The pressure sensor PSR may include a first base substrate BS1, a plurality of first conductive patterns CP1, a pressure sensitive material layer PSL, a second base substrate BS2, a plurality of second conductive patterns CP2, and an adhesive layer ADL. Also, the pressure sensor PSR may include a groove part HP provided in the first base substrate BS1.

The first conductive patterns CP1 and the second conductive patterns CP2, which are included in the pressure sensor PSR, may be made of a transparent conductive material to have no influence on an image emitted from the display panel PNL.

In an exemplary embodiment, a back surface of the first base substrate BS1 may correspond to a top surface of the window WD. In this case, the groove part HP may correspond to a bent region BA of the first base substrate BS1, and include a plurality of trenches TRE having a shape that is dug deep toward a top surface of the first base substrate BS1 from the top surface of the window WD, which corresponds to the back surface of the first base substrate BS1.

In an exemplary embodiment, since the second base substrate BS2 of the pressure sensor PSR is provided in the uppermost layer of the display device, shock from the outside may be directly applied to the second base substrate BS2. Therefore, the second base substrate BS2 may be made of a material strong against shock to protect the display device from external shock.

Also, the second base substrate BS2 may not include a component corresponding to the groove part HP of the first base substrate BS1. When the second base substrate BS2 includes a component corresponding to the groove part HP, if shock from the outside is applied to the second base substrate BS2, the component may be easily damaged. In particular, a crack, etc. may occur in the vicinity of the component. As the crack advances to the entire surface of the second base substrate BS2, a defect of the second base substrate BS2 may be caused. Therefore, when the pressure sensor PSR is provided in the uppermost layer of the display device, the second base substrate BS2 may not include a component corresponding to the groove part HP provided in the first base substrate BS1.

The display device according to the exemplary embodiments can be employed in various electronic devices. For example, the display device is applicable to televisions, notebook computers, cellular phones, smart phones, smart pads, PMPs, PDAs, navigations, various wearable devices such as smart watches, and the like.

According to the exemplary embodiments, it is possible to provide a display device having a pressure sensor that facilitates functions requiring the location and/or intensity of touch inputs and is capable of reducing the thickness of the display device, which may facilitate flexibility of a foldable device. For example, an adhesive layer that connects opposing substrates of the display device may be disposed in the same layer as the pressure sensitive material in the pressure sensor.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel; and
a sensor disposed on one surface of the display panel to detect external pressure,
wherein the sensor has a sensing region and a non-sensing region and comprises:
a first base substrate having flexibility and including a flexible region having a first flexibility enhancing part formed in the sensing region;
a plurality of first conductive patterns extending in a first direction in the sensing region of the first base substrate;
a second base substrate facing opposite to the first base substrate, the second base substrate having flexibility and including a flexible region having a second flexibility enhancing part formed in the sensing region;
a plurality of second conductive patterns extending in a second direction intersecting the first conductive patterns disposed on a surface of the second base substrate;
a pressure sensitive material layer disposed in a space formed between the first and second conductive patterns and substantially filing the space without any gaps, the pressure sensitive material layer having a resistance that varies in response to pressure; and
an adhesive layer connecting the first and second base substrate, the adhesive layer being disposed in the same layer as the pressure sensitive material layer,
wherein the first flexibility enhancing part is formed on a surface on which the first conductive patterns on the first base substrate and the pressure sensitive material layer are not disposed.

2. The display device of claim 1, wherein, when external pressure is applied to the sensor, the resistance of the pressure sensitive material layer corresponding to a region in which the pressure is applied decreases.

3. The display device of claim 2, wherein the pressure sensitive material layer comprises a polymer compound and conductive particles dispersed in the polymer compound.

4. The display device of claim 2, wherein the pressure sensitive material layer is disposed in the extending direction of the first conductive patterns in the sensing region.

5. The display device of claim 4, wherein the pressure sensitive material layer overlaps with at least some of the plurality of first conductive patterns.

6. The display device of claim 1, wherein the adhesive layer comprises a first adhesive pattern disposed in the sensing region, and a second adhesive pattern disposed in the non-sensing region, the second adhesive pattern connecting with the first adhesive pattern.

7. The display device of claim 6, wherein the first adhesive pattern is disposed between ones of the first conductive patterns or between ones of the second conductive patterns.

8. The display device of claim 7, wherein the first adhesive pattern is disposed along the extending direction of the first conductive patterns or the second conductive patterns, and the second adhesive pattern is disposed along an edge of the sensing region in the non-sensing region.

9. The display device of claim 8, wherein the first adhesive pattern has a width smaller than the distance between adjacent second conductive patterns.

10. The display device of claim 8, wherein the first adhesive pattern has a width equal to the distance between adjacent second conductive patterns.

11. The display device of claim 6, wherein the adhesive layer has a thickness smaller than a value obtained by adding the thickness of the first conductive pattern and the thickness of the pressure sensitive material layer.

12. The display device of claim 6, wherein the adhesive layer comprises a pressure sensitive adhesive (PSA).

13. The display device of claim 1, wherein the second flexibility enhancing part is formed on a surface on which the second conductive patterns on the second base substrate are not disposed.

14. The display device of claim 13, wherein the first flexibility enhancing part comprises at least one first discontinuity, and the second flexibility enhancing part includes at least one second discontinuity.

15. The display device of claim 14, wherein the first discontinuity comprises a first trench having a shape that is recessed toward the other surface of the first base substrate, on which the first conductive patterns are disposed, from one surface of the first base substrate, and
the second discontinuity comprises a second trench having a shape that is recessed toward the other surface of the second base substrate, on which the second conductive patterns are disposed, from one surface of the second base substrate.

16. The display device of claim 15, wherein each of the first trench and the second trench has a width corresponding to about $2\pi n$ when the curvature of a corresponding bent region is nR (n is a natural number of 1 or more).

17. The display device of claim 15, wherein each of the first trench and the second trench are alternately disposed.

18. The display device of claim 17, wherein the first trench has a depth that is equal to or smaller than a half of the thickness of the first base substrate, and the second trench has a depth that is equal to or smaller than a half of the thickness of the second base substrate.

19. The display device of claim 1, wherein the sensor is disposed on a surface of the display panel opposite to that surface from which light is emitted.

20. The display device of claim 1, wherein the pressure sensitive material layer is disposed between the first and second conductive patterns to fill air in between the first and second conductive patterns.

21. A display device comprising:
a display panel;
a window disposed on a surface from which light of the display panel is emitted;
a polarizing film disposed between the display panel and the window; and
a sensor disposed on one surface of the display panel,
wherein the sensor has a sensing region and a non-sensing region and comprises:
a first base substrate having a flexible region that is foldable, the first base substrate comprising a first flexibility enhancing part formed in the sensing region;
a plurality of first conductive patterns extending in a first direction in the sensing region of the first base substrate;
a second base substrate facing opposite to the first base substrate, the second base substrate having flexibility and including a flexible region having a second flexibility enhancing part formed in the sensing region;
a plurality of second conductive patterns extending in a second direction intersecting the first conductive patterns disposed on a surface of the second base substrate;
a pressure sensitive material layer disposed in a space formed between the first and second conductive patterns and substantially filing the space without any gaps, the pressure sensitive material layer having a resistance that varies in response to pressure; and
an adhesive layer connecting the first and second base substrates, the adhesive layer being disposed in the same layer as the pressure sensitive material layer,
wherein the first flexibility enhancing part is formed on a surface on which the first conductive patterns on the first base substrate and the pressure sensitive material layer are not disposed.

22. The display device of claim 21, wherein, when external pressure is applied to the sensor, the resistance of the pressure sensitive material layer corresponding to a region in which the pressure is applied decreases, and
the pressure sensitive material layer comprises a polymer compound and conductive particles dispersed in the polymer compound.

23. The display device of claim 22, wherein the pressure sensitive material layer is disposed along the extending direction of the first conductive patterns in the sensing region, and
wherein the pressure sensitive material layer overlaps with each first conductive pattern.

24. The display device of claim 21, wherein the adhesive layer comprises a first adhesive pattern disposed in the sensing region, and a second adhesive pattern disposed in the non-sensing region, the second adhesive pattern connects with the first adhesive pattern.

25. The display device of claim 24, wherein the first adhesive pattern is disposed between and spaced part from adjacent first conductive patterns or between spaced part from adjacent second conductive patterns.

26. The display device of claim 25, wherein the first adhesive pattern is disposed along the extending direction of the first conductive patterns or the second conductive pattern, and the second adhesive pattern is disposed along an edge of the sensing region in the non-sensing region.

27. The display device of claim 21, wherein the sensor is disposed on a surface from which light from the display panel is not emitted.

28. The display device of claim 21,
wherein the second flexibility enhancing part is formed on a surface on which the second conductive patterns on the second base substrate are not disposed.

29. The display device of claim 28, wherein the first flexibility enhancing part comprises at least one first discontinuity, and the second flexibility enhancing part comprises at least one second discontinuity.

30. The display device of claim 29, wherein the first discontinuity comprises a first trench having a shape that is recessed toward the other surface of the first base substrate, on which the first conductive patterns are disposed, from one surface of the first base substrate, and
the second discontinuity comprises a second trench having a shape that is recessed toward the other surface of the second base substrate, on which the second conductive patterns are disposed, from one surface of the second base substrate.

31. The display device of claim 30, further comprising a cushion layer disposed on a surface from which light from the display panel is not emitted, the cushion layer comprising an elastically deformable material.

32. The display device of claim 31, wherein the cushion layer comprises a first surface corresponding to the surface from which light from the display panel is not emitted and a second surface opposite to the first surface,
wherein the sensor is disposed on the second surface of the cushion layer.

33. The display device of claim 21, wherein the sensor is disposed between the surface from which light from the display panel is emitted and the polarizing film.

34. The display device of claim 21, wherein the polarizing film comprises a first surface corresponding to the surface from which light from the display panel is emitted and a second surface opposite to the first surface,
  wherein the sensor is disposed between the second surface of the polarizing film and the window.

35. The display device of claim 21, wherein the window comprises a first surface corresponding to the surface from which light from the display panel is emitted and a second surface opposite to the first surface,
  wherein the sensor is disposed on the second surface of the window.

36. The display device of claim 35, wherein the first flexibility enhancing part comprises at least one trench having a shape that is recessed toward the other surface of the first base substrate, on which the first conductive patterns are disposed, from one surface of the first base substrate, which corresponds to the second surface of the window.

* * * * *